(12) United States Patent
Yamazaki et al.

(10) Patent No.: US 11,071,224 B2
(45) Date of Patent: Jul. 20, 2021

(54) FUNCTIONAL PANEL, METHOD FOR MANUFACTURING THE SAME, MODULE, DATA PROCESSING DEVICE

(71) Applicant: Semiconductor Energy Laboratory Co., Ltd., Atsugi (JP)

(72) Inventors: Shunpei Yamazaki, Tokyo (JP); Kohei Yokoyama, Kanagawa (JP); Yoshiharu Hirakata, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 14/922,753

(22) Filed: Oct. 26, 2015

(65) Prior Publication Data
US 2016/0120054 A1     Apr. 28, 2016

(30) Foreign Application Priority Data

Oct. 28, 2014  (JP) .............................. JP2014-219065
Oct. 28, 2014  (JP) .............................. JP2014-219066

(51) Int. Cl.
*H05K 7/02*      (2006.01)
*H01L 51/52*     (2006.01)
(Continued)

(52) U.S. Cl.
CPC ............... *H05K 7/02* (2013.01); *G09F 9/00* (2013.01); *H01L 23/10* (2013.01);
(Continued)

(58) Field of Classification Search
CPC ............. H01L 51/5253; H01L 51/5246; H01L 51/5265
See application file for complete search history.

(56) References Cited

U.S. PATENT DOCUMENTS

| 4,357,557 A | 11/1982 | Inohara et al. |
| 4,640,583 A | 2/1987 | Hoshikawa et al. |

(Continued)

FOREIGN PATENT DOCUMENTS

| CN | 1819300 A | * | 8/2006 | ......... H01L 51/5246 |
| DE | 102008048472 A1 | * | 3/2010 | ........... H01L 51/448 |

(Continued)

OTHER PUBLICATIONS

International Search Report (Application No. PCT/IB2015/058099) dated Feb. 2, 2016.

(Continued)

*Primary Examiner* — Mariceli Santiago
(74) *Attorney, Agent, or Firm* — Fish & Richardson P.C.

(57) ABSTRACT

A novel, highly convenient or reliable functional panel is provided. A novel, highly convenient or reliable method for manufacturing a functional panel is provided. The functional panel includes a first base; a second base having a region overlapping with the first base; a bonding layer that bonds the first base to the second base; and an insulating layer in contact with the first base, the second base, and the bonding layer. With this structure, an opening which is formed easily in a region where the bonding layer is in contact with the first base or the second base can be filled with the insulating layer, which can prevent impurities from being diffused into the functional layer located in a region surrounded by the first base, the second base, and the bonding layer that bonds the first base to the second base.

10 Claims, 22 Drawing Sheets

(51) Int. Cl.
   *G09F 9/00* (2006.01)
   *H01L 23/10* (2006.01)
(52) U.S. Cl.
   CPC ...... *H01L 51/5237* (2013.01); *H01L 51/5253* (2013.01); *H01L 51/5265* (2013.01)

(56) References Cited

U.S. PATENT DOCUMENTS

| | | | |
|---|---|---|---|
| 6,219,127 B1 | 4/2001 | Hirakata et al. | |
| 6,580,094 B1 | 6/2003 | Yamazaki et al. | |
| 6,605,826 B2 | 8/2003 | Yamazaki et al. | |
| 6,864,943 B2 | 3/2005 | Hirakata et al. | |
| 7,189,999 B2 | 3/2007 | Yamazaki et al. | |
| 7,199,855 B2 | 4/2007 | Yoshimi et al. | |
| 7,230,669 B1 | 6/2007 | Tashiro et al. | |
| 7,283,185 B2 | 10/2007 | Hirakata et al. | |
| 7,369,212 B2 | 5/2008 | Tashiro et al. | |
| 7,372,535 B2 | 5/2008 | Tashiro et al. | |
| 7,453,089 B2 | 11/2008 | Yamazaki et al. | |
| 7,579,203 B2 | 8/2009 | Yamazaki et al. | |
| 7,678,668 B2 | 3/2010 | Shimomura et al. | |
| 7,733,457 B2 | 6/2010 | Tashiro et al. | |
| 7,738,073 B2 | 6/2010 | Inoue et al. | |
| 7,897,003 B2 | 3/2011 | Tashiro | |
| 8,106,407 B2 | 1/2012 | Yamazaki et al. | |
| 8,289,481 B2 | 10/2012 | Tashiro et al. | |
| 8,497,516 B2 | 7/2013 | Yamazaki et al. | |
| 8,648,345 B2 | 2/2014 | Yamazaki et al. | |
| 8,735,874 B2 | 5/2014 | Yamazaki et al. | |
| 8,735,899 B2 | 5/2014 | Yamazaki et al. | |
| 8,871,536 B2 | 10/2014 | Yamazaki et al. | |
| 8,933,468 B2 | 1/2015 | Mandlik et al. | |
| 9,136,286 B2 | 9/2015 | Okamoto et al. | |
| 9,231,156 B2 | 1/2016 | Yamane et al. | |
| 9,263,697 B2 | 2/2016 | Yamazaki et al. | |
| 9,281,497 B2 | 3/2016 | Yamazaki et al. | |
| 9,766,763 B2* | 9/2017 | Jinbo | G06F 3/044 |
| 9,768,239 B2 | 9/2017 | Yamazaki et al. | |
| 10,236,331 B2 | 3/2019 | Yamazaki et al. | |
| 2002/0024096 A1* | 2/2002 | Yamazaki | H01L 51/5246 257/359 |
| 2003/0027369 A1* | 2/2003 | Yamazaki | H01L 51/003 438/21 |
| 2006/0220550 A1 | 10/2006 | Harada | |
| 2006/0246811 A1 | 11/2006 | Winters et al. | |
| 2006/0275926 A1* | 12/2006 | Carcia | H01L 51/5253 438/1 |
| 2007/0065578 A1 | 3/2007 | Mcdougall | |
| 2007/0072439 A1 | 3/2007 | Akimoto et al. | |
| 2007/0108446 A1 | 5/2007 | Akimoto | |
| 2007/0170839 A1 | 7/2007 | Choi et al. | |
| 2007/0170854 A1 | 7/2007 | Kwak | |
| 2007/0170860 A1 | 7/2007 | Choi et al. | |
| 2007/0275181 A1* | 11/2007 | Carcia | C23C 16/403 427/582 |
| 2008/0123042 A1 | 5/2008 | Tashiro et al. | |
| 2008/0131646 A1 | 6/2008 | Tanaka | |
| 2009/0004772 A1 | 1/2009 | Jinbo et al. | |
| 2010/0060158 A1 | 3/2010 | Kase et al. | |
| 2010/0134746 A1 | 6/2010 | Tashiro et al. | |
| 2010/0293782 A1 | 11/2010 | Yamazaki et al. | |
| 2011/0012112 A1 | 1/2011 | Yamazaki et al. | |
| 2011/0049730 A1* | 3/2011 | Schmid | C23C 16/54 257/787 |
| 2012/0061718 A1 | 3/2012 | Yamazaki et al. | |
| 2012/0126234 A1 | 5/2012 | Yamazaki et al. | |
| 2012/0161603 A1 | 6/2012 | Van Montfort et al. | |
| 2012/0241802 A1 | 9/2012 | Philippens et al. | |
| 2012/0256208 A1* | 10/2012 | Hatano | H01L 51/504 257/89 |
| 2012/0300151 A1 | 11/2012 | Yamazaki et al. | |
| 2013/0001582 A1 | 1/2013 | Kadono et al. | |
| 2013/0048967 A1 | 2/2013 | Nishido et al. | |
| 2013/0126915 A1* | 5/2013 | Chan | H01L 51/5253 257/88 |
| 2013/0127335 A1* | 5/2013 | Chang | H05B 33/04 313/512 |
| 2013/0140547 A1* | 6/2013 | Lee | H01L 51/5256 257/40 |
| 2013/0285024 A1 | 10/2013 | Ma et al. | |
| 2013/0337259 A1* | 12/2013 | Carcia | C09D 5/00 428/336 |
| 2014/0063432 A1 | 3/2014 | Yamazaki et al. | |
| 2014/0065430 A1 | 3/2014 | Yamazaki et al. | |
| 2014/0291662 A1* | 10/2014 | Baisl | H01L 51/5253 257/40 |
| 2015/0041794 A1* | 2/2015 | Gong | H01L 51/5253 257/40 |
| 2015/0053959 A1 | 2/2015 | Yamazaki et al. | |
| 2015/0108461 A1 | 4/2015 | Mandlik et al. | |
| 2016/0118416 A1 | 4/2016 | Yamazaki et al. | |
| 2016/0147109 A1 | 5/2016 | Yamazaki et al. | |
| 2016/0154268 A1 | 6/2016 | Yamazaki et al. | |
| 2016/0155984 A1 | 6/2016 | Yamazaki et al. | |
| 2016/0190055 A1 | 6/2016 | Jinbo et al. | |

FOREIGN PATENT DOCUMENTS

| | | | | |
|---|---|---|---|---|
| JP | 62-091623 A | | 6/1987 | |
| JP | 05-005890 A | | 1/1993 | |
| JP | 10-172757 | | 6/1998 | |
| JP | 2002-151253 A | | 5/2002 | |
| JP | 2003255562 A | * | 9/2003 | ............ G03F 7/16 |
| JP | 2004-103337 A | | 4/2004 | |
| JP | 2006-286266 A | | 10/2006 | |
| JP | 2007-123861 | | 5/2007 | |
| JP | 2007-165861 | | 6/2007 | |
| JP | 2009-033151 A | | 2/2009 | |
| JP | 2010-067350 A | | 3/2010 | |
| JP | 2011-003537 A | | 1/2011 | |
| JP | 2011-018479 | | 1/2011 | |
| JP | 2011-044699 | | 3/2011 | |
| JP | 2011-053672 A | | 3/2011 | |
| JP | 2011-112829 A | | 6/2011 | |
| JP | 4877605 | | 2/2012 | |
| JP | 2013-197099 A | | 9/2013 | |
| JP | 2014-151571 A | | 8/2014 | |
| JP | 2015-181115 A | | 10/2015 | |
| KR | 20060051830 A | * | 5/2006 | ......... H01L 51/0097 |
| KR | 100647705 B1 | * | 11/2006 | |
| KR | 2007-0114726 A | | 12/2007 | |
| KR | 10-1232479 | | 2/2013 | |
| TW | 200721272 | | 6/2007 | |
| TW | 201230428 | | 7/2012 | |
| TW | 201236232 | | 9/2012 | |
| TW | I381765 | | 1/2013 | |
| WO | WO-2006/080393 | | 8/2006 | |
| WO | WO-2006/088185 | | 8/2006 | |
| WO | WO-2007/038050 | | 4/2007 | |
| WO | WO-2011074214 A1 | * | 6/2011 | ............ C23C 16/30 |
| WO | WO-2012/039310 | | 3/2012 | |
| WO | WO-2013/046545 | | 4/2013 | |

OTHER PUBLICATIONS

Written Opinion (Application No. PCT/IB2015/058099) dated Feb. 2, 2016.

Taiwanese Office Action (Application No. 104135085) dated Apr. 23, 2020.

* cited by examiner

200B

200B

200B

200B

FIG. 6A1
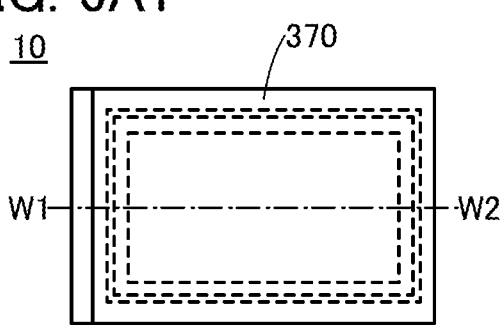
FIG. 6A2
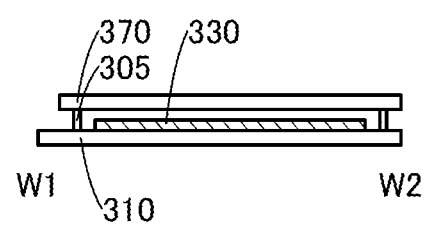
FIG. 6B1
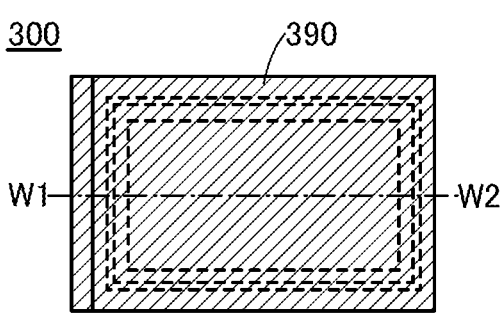
FIG. 6B2
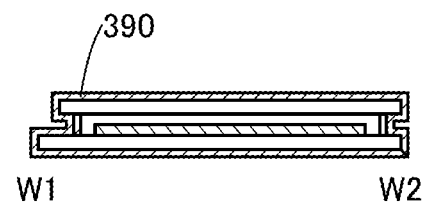

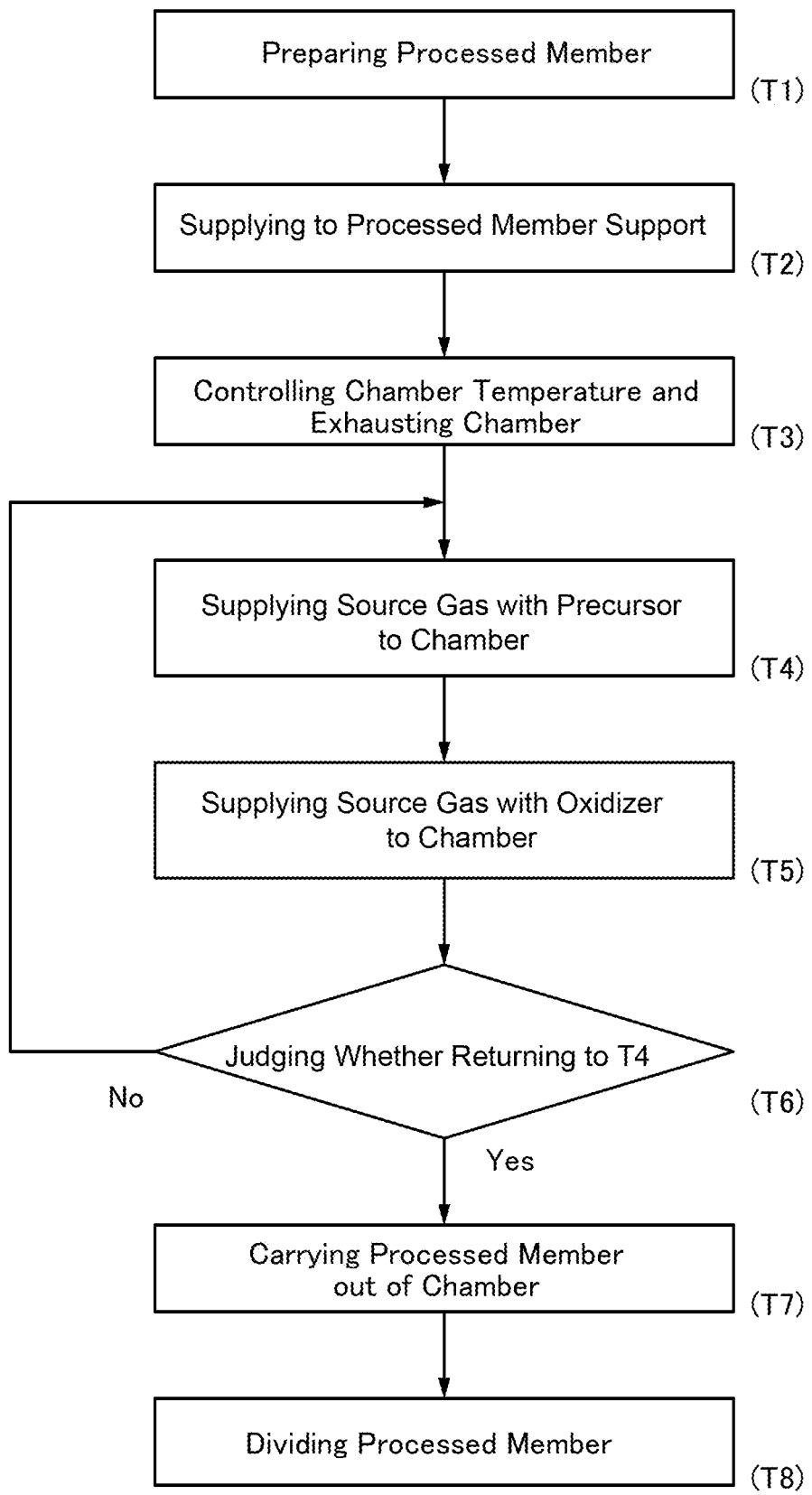

FIG. 8A1
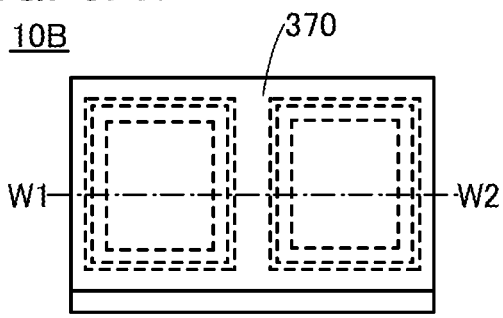
FIG. 8A2
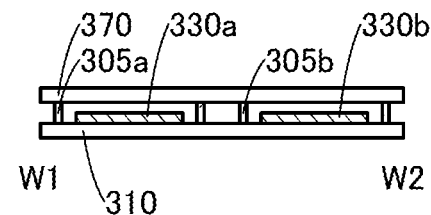
FIG. 8B1
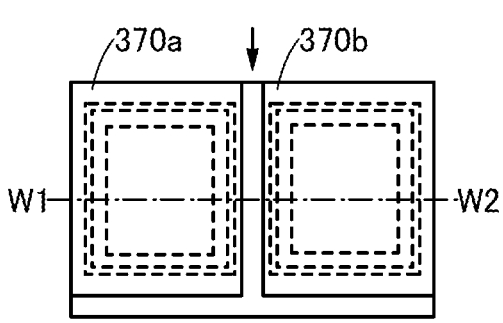
FIG. 8B2
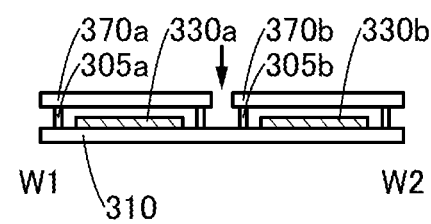
FIG. 8C1
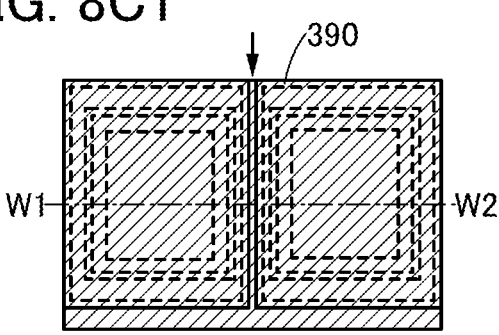
FIG. 8C2
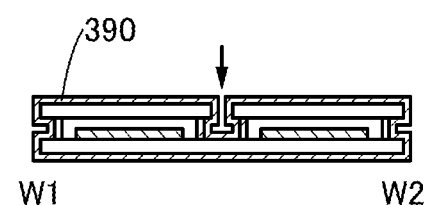
FIG. 8D1
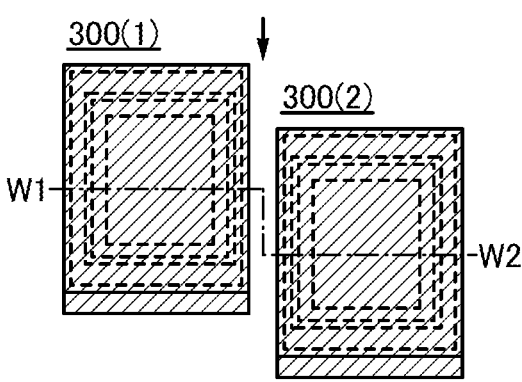
FIG. 8D2
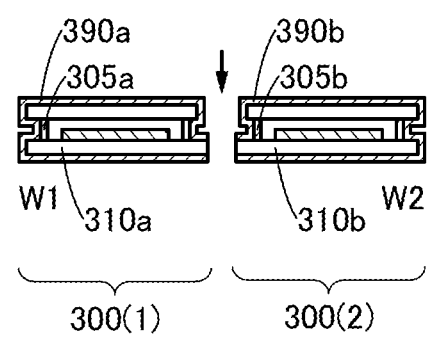

ALD

FIG. 15A
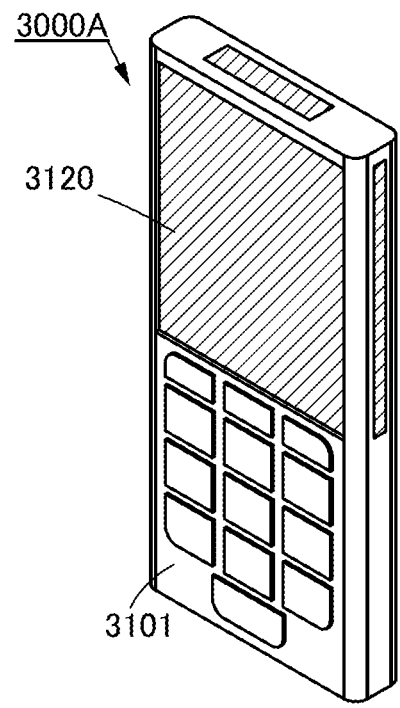
FIG. 15B
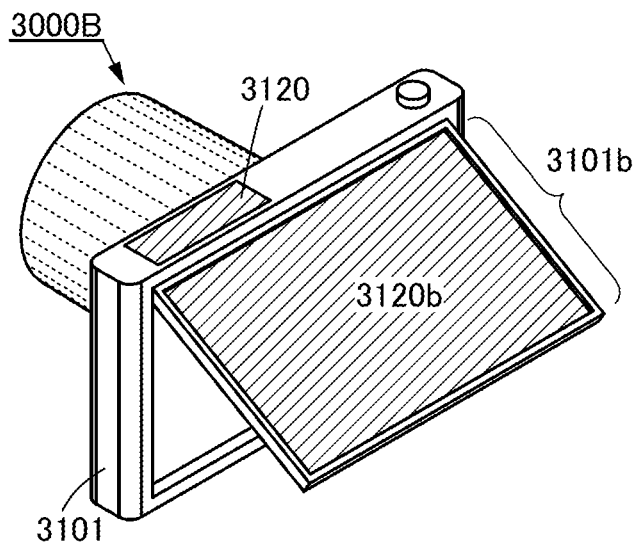
FIG. 15C1
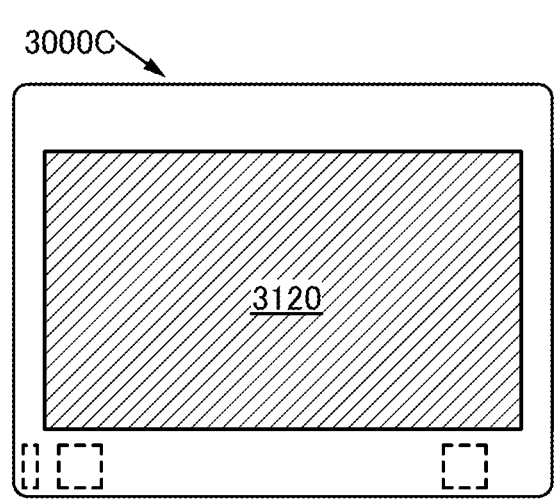
FIG. 15C2
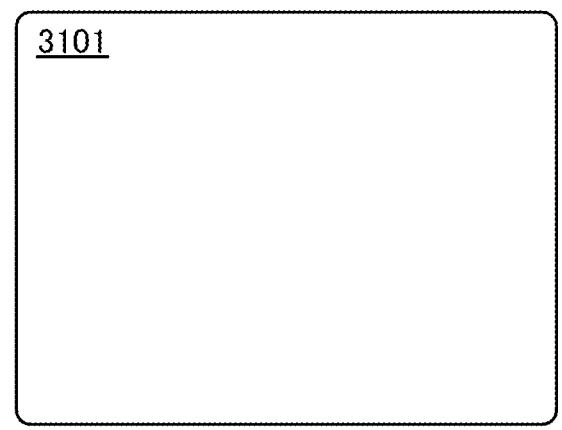

FIG. 16A1
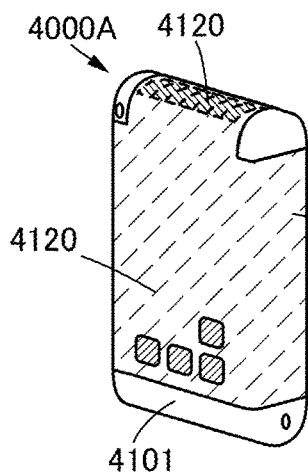
FIG. 16A2
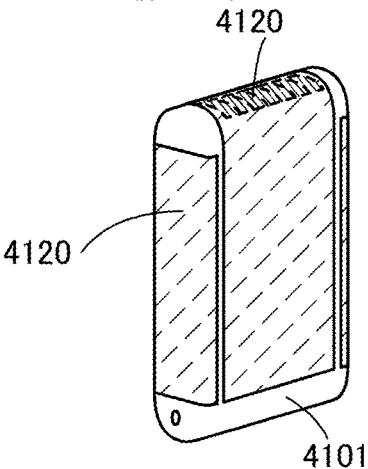
FIG. 16A3
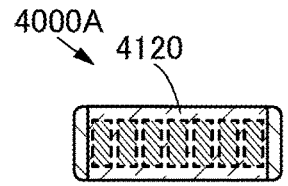
FIG. 16B1
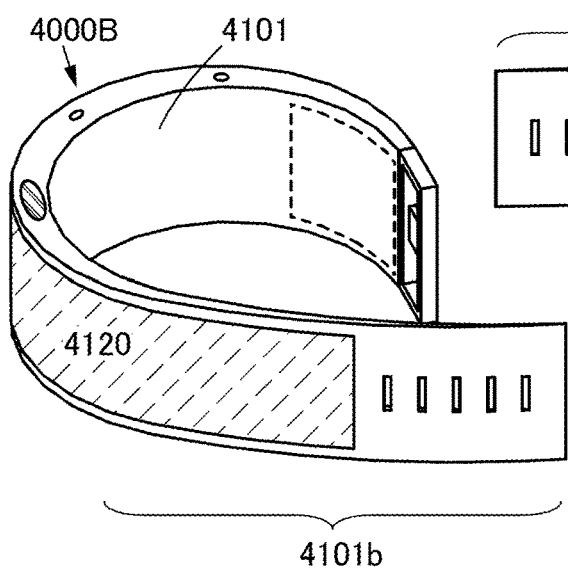
FIG. 16B2
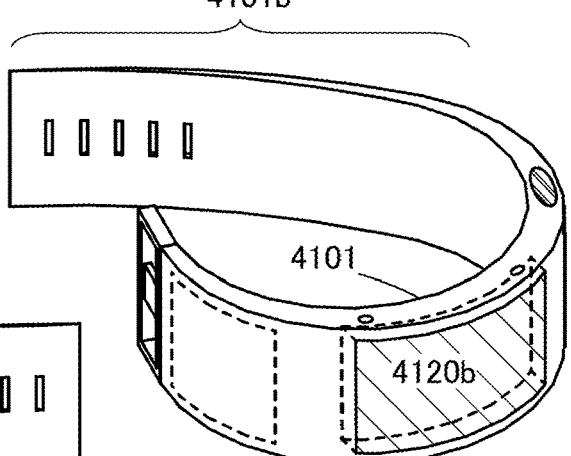
FIG. 16C1
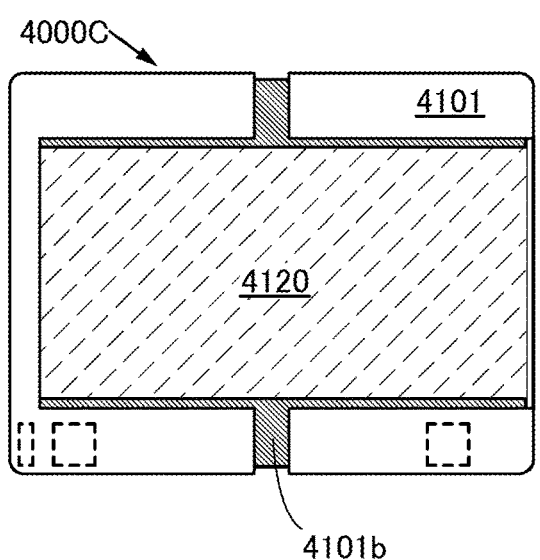
FIG. 16C2
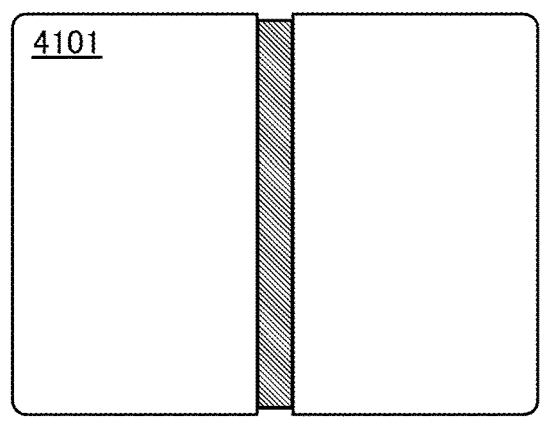

200(1)

200(1)

FUNCTIONAL PANEL, METHOD FOR MANUFACTURING THE SAME, MODULE, DATA PROCESSING DEVICE

TECHNICAL FIELD

One embodiment of the present invention relates to a functional panel, a method for manufacturing the functional panel, a module, and an data processing device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, an data processing device, a method for driving any of them, and a method for manufacturing any of them.

BACKGROUND ART

Functions of some functional elements are impaired because of impurity diffusion. In order to maintain the functions of such functional elements, the following invention is known (Patent Document 1): a functional element is sealed in a space surrounded by a substrate provided with the functional elements, a sealing substrate, and a sealant for bonding the substrate and the sealing substrate.

REFERENCE

Patent Document

[Patent Document 1] United States Published Patent Application No. 2007/0170854

DISCLOSURE OF INVENTION

An object of one embodiment of the present invention is to provide a novel, highly convenient or reliable functional panel. Another object of one embodiment of the present invention is to provide a novel, highly convenient or reliable method for manufacturing a functional panel. Another object of one embodiment of the present invention is to provide a novel functional panel, a novel method for manufacturing a functional panel, and a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

Means for Solving the Problems

One embodiment of the present invention is a functional panel including a first base; a second base having a region overlapping with the first base; a bonding layer that bonds the second base to one of surfaces of the first base; an insulating layer in contact with the first base, the second base, and the bonding layer; and a functional layer located in a region surrounded by the first base, the second base, and the bonding layer.

The functional layer includes a plurality of functional elements.

Another embodiment of the present invention is the above-described functional panel in which the functional elements include a light-emitting element.

Another embodiment of the present invention is the above-described functional panel in which the functional elements include a display element.

Another embodiment of the present invention is the above-described functional panel in which the functional elements include a transistor.

The functional panel of one embodiment of the present invention includes a first base; a second base having a region overlapping with the first base; a bonding layer that bonds the first base to the second base; and an insulating layer in contact with the first base, the second base, and the bonding layer. With this structure, an opening which is formed easily in a region where the bonding layer is in contact with the first base or the second base can be filled with the insulating layer, which can prevent impurities from being diffused into the functional layer located in a region surrounded by the first base, the second base, and the bonding layer. Thus, the novel, highly convenient or reliable functional panel can be provided.

Another embodiment of the present invention is a method for manufacturing a functional panel including the following six steps.

In a first step, a processed member including a first base; a second base having a region overlapping with the first base; a bonding layer that bonds the second base to one of surfaces of the first base; and a functional layer which is located in a region surrounded by the first base, the second base, and the bonding layer and includes a plurality of functional elements is prepared and supplied to a processed member support.

In a second step, the temperature of the processed member is controlled to have a predetermined value, and a chamber where the processed member support is provided is exhausted.

In a third step, a source gas containing a precursor compound is supplied to the chamber, and is then purged from the chamber.

In a fourth step, a source gas containing an oxidizer is supplied to the chamber, and is then purged from the chamber.

In a fifth step, in the case where the number of repeated cycles each including the third step and the fourth step is less than a predetermined number of repeated cycles, the process returns to the third step. In the case where the number of repeated cycles is greater than or equal to a predetermined number of repeated cycles, the process proceeds to a sixth step.

In the sixth step, the processed member is carried out of the chamber. Here, formation of the insulating layer is terminated.

Another embodiment of the present invention is a method for manufacturing a functional panel including the following eight steps.

In a first step, a processed member which includes a first base; a second base having a region overlapping with the first base; a first bonding layer and a second bonding layer that bond the second base to one of surfaces of the first base; a first functional layer which is located in a region surrounded by the first base, the second base, and the first bonding layer and includes a plurality of functional elements; and a second functional layer which is located in a region surrounded by the first base, the second base, and the second bonding layer and includes a plurality of functional elements is prepared. An opening is formed in a region of the second base overlapping with a region between the first bonding layer and the second bonding layer.

In a second step, the processed member is supplied to a processed member support In a third step, the temperature of the processed member is controlled to have a predetermined value, and a chamber where the processed member support is provided is exhausted.

In a fourth step, a source gas containing a precursor compound is supplied to the chamber, and is then purged from the chamber.

In a fifth step, a source gas containing an oxidizer is supplied to the chamber, and is then purged from the chamber.

In a sixth step, in the case where the number of repeated cycles each including the third step and the fourth step is less than a predetermined number of repeated cycles, the process returns to the fourth step. In the case where the number of repeated cycles is greater than or equal to a predetermined number of repeated cycles, the process proceeds to a seventh step.

In the seventh step, the processed member is carried out of the chamber. Here, formation of the insulating layer is terminated.

In an eighth step, the processed member is divided along the region overlapping with the region between the first bonding layer and the second bonding layer.

The method for manufacturing a functional panel of one embodiment of the present invention includes a step of supplying a source gas containing a precursor compound and then purging the source gas from the chamber; and a step of supplying a source gas containing an oxidizer and then purging the source gas from the chamber. Thus, the insulating layer containing an oxide of the precursor compound can be formed on a surface of the processed member. As a result, a novel method for manufacturing a functional panel can be provided.

Another embodiment of the present invention is a module including the functional panel according to any one of the above embodiments and an FPC or a touch sensor.

Another embodiment of the present invention is an data processing device including the functional panel according to any one of the above embodiments or the module, and a microphone, an antenna, a battery, an operation switch, or a housing.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

Note that a light-emitting device in this specification means an image display device or a light source (including a lighting device). In addition, the light-emitting device might include any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a substrate over which a light-emitting element is formed by a chip on glass (COG) method.

One embodiment of the present invention can provide a novel, highly convenient or reliable functional panel. According to another embodiment of the present invention, a novel, highly convenient or reliable method for manufacturing a functional panel can be provided. Another embodiment of the present invention is to provide a novel functional panel, a novel method for manufacturing a functional panel, and a novel semiconductor device.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 6A1, 6A2, 6B1, and 6B2 are schematic views illustrating a method for manufacturing a functional panel of one embodiment.

FIG. 7 is a flow chart showing a method for manufacturing a functional panel of one embodiment.

FIGS. 8A1, 8A2, 8B1, 8B2, 8C1, 8C2, 8D1, and 8D2 are schematic views illustrating a method for manufacturing a functional panel of one embodiment.

FIGS. 15A, 15B, 15C1, and 15C2 are diagrams each illustrating a structure of an data processing device of one embodiment.

FIGS. 16A1, 16A2, 16A3, 16B1, 16B2, 16C1, and 16C2 are diagrams each illustrating a structure of an data processing device of one embodiment.

BEST MODE FOR CARRYING OUT THE INVENTION

Figure 1A:
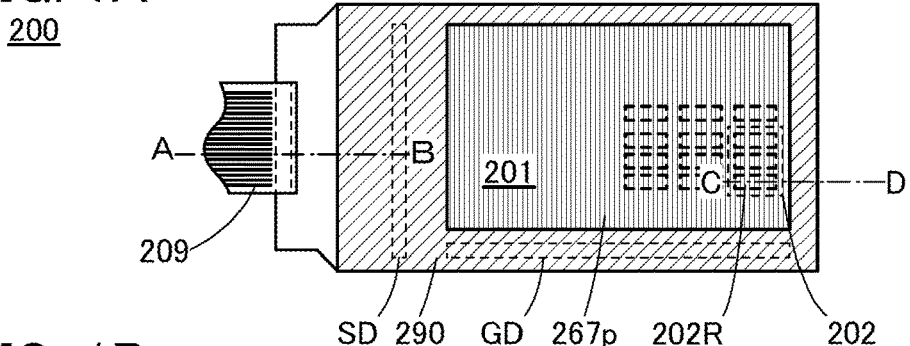
FIGS. 1A to 1D illustrate structures of a functional panel of one embodiment.

A functional panel of one embodiment of the present invention includes a first base; a second base having a region overlapping with the first base; a bonding layer that bonds the first base to the second base; and an insulating layer in contact with the first base, the second base, and the bonding layer.

Thus, an opening which is formed easily in a region where the bonding layer is in contact with the first base or the second base can be filled with the insulating layer, which can prevent impurities from being diffused into the functional layer located in a region surrounded by the first base, the second base, and the bonding layer that bonds the first base to the second base.

Thus, the novel, highly convenient or reliable functional panel can be provided.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, a structure of a functional panel of one embodiment of the present invention will be described with reference to FIGS. 1A to 1D, FIGS. 2A to 2D, FIGS. 3A to 3D, and FIGS. 4A to 4D.

Figure 1B:
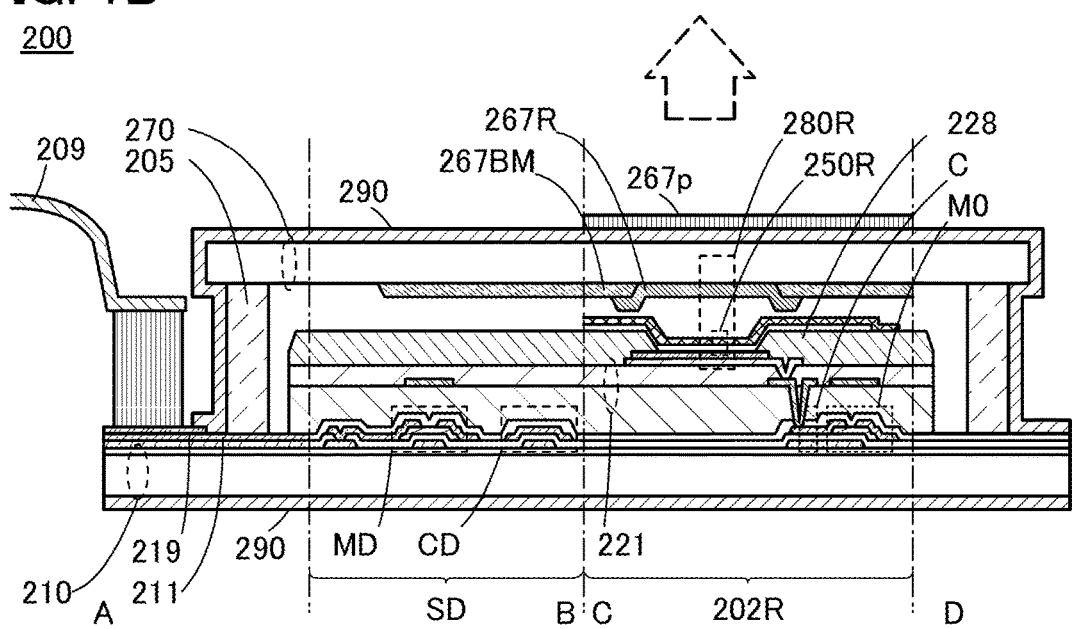
Figure 1C:
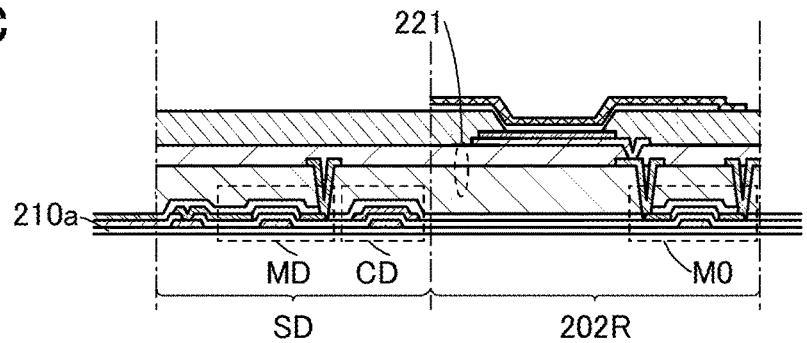
Figure 1D:
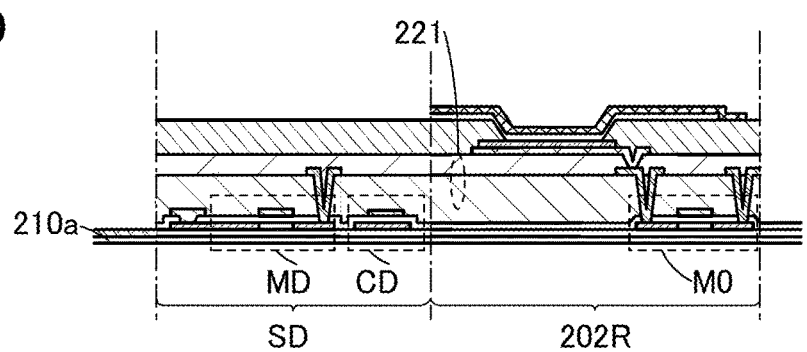
Figure 2A:
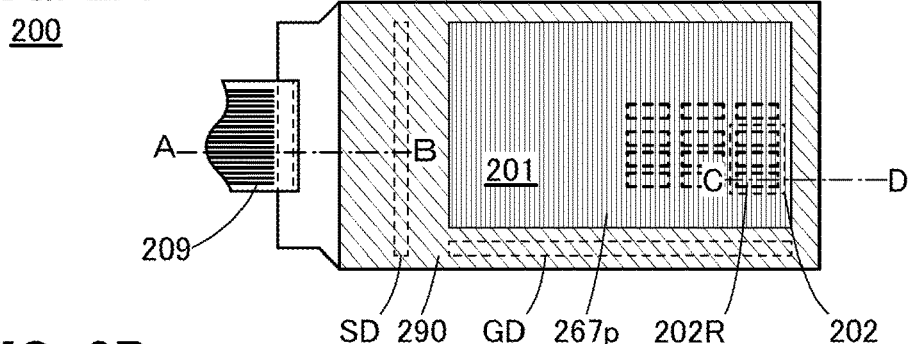
FIGS. 2A to 2D illustrate structures of a functional panel of one embodiment.
Figure 2B:
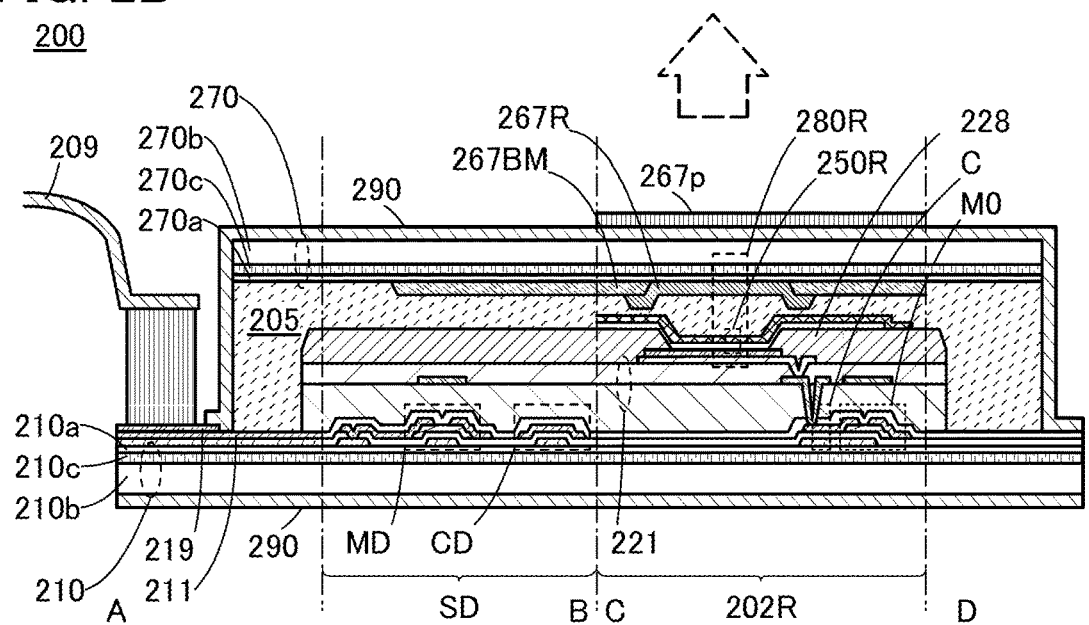
Figure 2C:
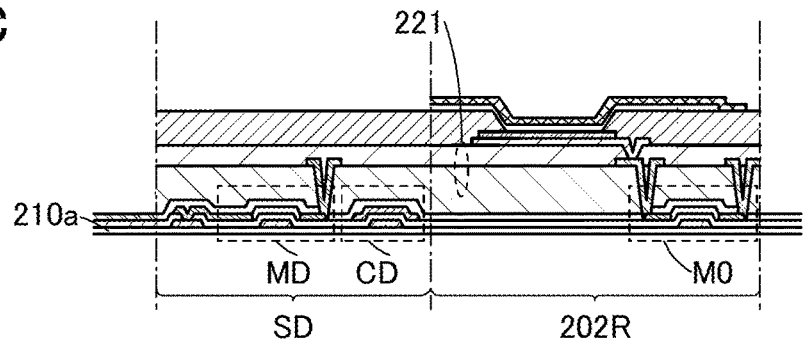
Figure 2D:
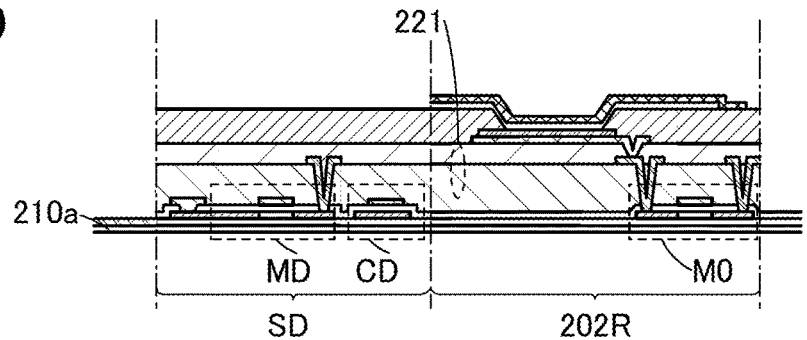

FIGS. 1A and 1D illustrate structures of a functional panel of one embodiment of the present invention. FIG. 1A is a top view of a functional panel 200 of one embodiment of the present invention, and FIG. 1B is a cross-sectional view taken along lines A-B and C-D in FIG. 1A. FIGS. 1C and 1D are cross-sectional views each illustrating a structure in which part of the structure in FIG. 1B is changed.

<Structure Example 1 of Functional Panel>

The functional panel 200 in this embodiment includes a first base 210; a second base 270 having a region overlapping with the first base 210; a bonding layer 205 that bonds the second base 270 to one of surfaces of the first base 210; an insulating layer 290 in contact with the first base 210, the second base 270, and the bonding layer 205; and a functional layer located in a region surrounded by the first base 210, the second base 270, and the bonding layer 205 (see FIG. 1A).

The functional layer includes a plurality of functional elements.

The functional panel 200 described in this embodiment includes the first base 210; the second base 270; the bonding layer 205 that bonds the first base 210 to the second base 270; and the insulating layer 290 in contact with the first base 210, the second base 270, and the bonding layer 205. Note that a material having flexibility can be used for the first base 210 and the second base 270.

Thus, an opening which is formed easily in a region where the bonding layer is in contact with the first base or the second base can be filled with the insulating layer, which can prevent impurities from being diffused into the functional layer located in the region surrounded by the first base, the second base, and the bonding layer that bonds the first base to the second base. When a flexible material is used as the first base 210 and the second base 270, the functional panel can be bent or folded. Thus, the novel, highly convenient or reliable functional panel can be provided.

Note that the light-emitting element 250R can be used as the functional element. The functional panel 200 including the light-emitting element 250R can be referred to as a light-emitting module.

A display element can be used as the functional element. The functional panel 200 including the display element can be referred to as a display module.

A driving transistor MO can be used as a functional element.

Furthermore, the functional panel 200 of one embodiment of the present invention includes a pixel 202, a driving circuit GD for supplying a control signal to the pixel 202, a driving circuit SD for supplying a display signal to the pixel 202, and a region 201 where the pixel 202 is provided (see FIGS. 1A and 1B).

The pixel 202 is supplied with a display signal (see FIG. 1A). The pixel 202 includes a subpixel 202R and the like. The subpixel 202R is configured to display red. In addition, the pixel 202 includes a subpixel for displaying green, a subpixel for displaying blue, and the like.

The subpixel 202R includes a pixel circuit and a display module 280R (see FIG. 1B).

The pixel circuit includes the driving transistor MO and a capacitor C.

The display module 280R includes the light-emitting element 250R and a coloring layer 267R having a region overlapping with the light-emitting element 250R on a light-emitting side. Note that the light-emitting element 250R is one embodiment of the display element.

The light-emitting element 250R includes a lower electrode, an upper electrode, and a layer containing a light-emitting organic compound.

The circuit includes the driving transistor MO and is provided between the first base 210 and the light-emitting element 250R. The insulating film 221 is provided between the circuit and the light-emitting element 250R.

The driving transistor MO includes a second electrode. The second electrode of the driving transistor MO is electrically connected to the lower electrode of the light-emitting element 250R through an opening provided in the insulating film 221.

The capacitor C includes a first electrode and a second electrode. The first electrode of the capacitor C is electrically connected to a gate of the driving transistor MO. The second electrode of the capacitor C is electrically connected to the second electrode of the driving transistor MO.

The driver circuit SD includes a transistor MD and a capacitor CD.

The functional panel 200 of one embodiment of the present invention includes a wiring 211 electrically connected to the driving circuit SD, a terminal 219 electrically connected to the wiring 211, and a flexible printed circuit 209 electrically connected to the terminal 219.

A light-blocking layer 267BM having an opening in a region overlapping with the subpixel 202R is also included.

A partition 228 which has an opening in a region overlapping with the light-emitting element 250R and covers an end portion of the lower electrode is also included.

A functional film 267p having a region overlapping with the region 201 is also included (see FIG. 1B).

Note that the functional panel 200 can display data on the second base 270 side.

Individual components included in the functional panel 200 of one embodiment of the present invention will be described below. Note that these components cannot be clearly distinguished and one component also serves as another component or includes part of another component in some cases.

<Overall Structure>

The functional panel 200 includes the first base 210, the second base 270, the bonding layer 205, the insulating layer 290, and the functional layer.

The functional panel 200 also includes the pixel 202, the driving circuit GD, the driving circuit SD, the region 201, the subpixel 202R, the driving transistor MO, the capacitor C, the display module 280R, the light-emitting element 250R, the coloring layer 267R, the pixel circuit, the insulating film 221, the wiring 211, the terminal 219, the flexible printed circuit 209, the light-blocking layer 267BM, the partition 228, and the functional film 267p.

<<First Base 210>>

There is no particular limitation on the first base 210 as long as it has heat resistance high enough to withstand a manufacturing process and a thickness and a size that allow the first base 210 to be placed in a manufacturing apparatus.

For the first base 210, an organic material, an inorganic material, a composite material of an organic material and an inorganic material, or the like can be used. For example, an inorganic material such as glass, ceramic, or metal can be used for the first base 210.

Specifically, non-alkali glass, soda-lime glass, potash glass, crystal glass, or the like can be used for the first base 210. Specifically, an inorganic oxide film, an inorganic nitride film, an inorganic oxynitride film, or the like can be used for the first base 210. For example, a silicon oxide film, a silicon nitride film, a silicon oxynitride film, an alumina film, or the like can be used for the first base 210. SUS, aluminum, or the like can be used for the first base 210.

For example, an organic material such as a resin, a resin film, or plastic can be used for the first base 210. Specifically, a resin film or a resin plate of polyester, polyolefin, polyamide, polyimide, polycarbonate, an acrylic resin, or the like can be used for the first base 210.

For example, a composite material such as a resin film to which a metal plate, a thin glass plate, or a film of an inorganic material or the like is attached can be used for the first base 210. For example, a composite material formed by dispersing a fibrous or particulate metal, glass, an inorganic material, or the like into a resin film can be used for the first base 210. For example, a composite material formed by dispersing a fibrous or particulate resin, an organic material, or the like into an inorganic material can be used for the first base 210.

For the first base 210, a single-layer material or a stacked-layer material in which a plurality of layers are stacked can be used. For example, a stacked-layer material in which a base, an insulating film that prevents diffusion of impurities contained in the base, and the like are stacked can be used for the first base 210. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used for the first base 210. Alternatively, a stacked-layer material in which a resin, a film that prevents diffusion of impurities contained in the resin, such as a silicon oxide film, a silicon nitride film, or a silicon oxynitride film, and the like are stacked can be used for the first base 210.

For the first base 210, a flexible material can be used. For example, it is possible to use a material having flexibility high enough to be bent or be folded. Specifically, it is possible to use a material which can be bent with a radius of curvature of 5 mm or more, preferably 4 mm or more, further preferably 3 mm or more, particularly preferably 1 mm or more. For the first base 210, it is possible to use a material with a thickness greater than or equal to 2.5 µm and less than or equal to 3 µm, preferably greater than or equal to 5 µm and less than or equal to 1.5 µm, further preferably greater than or equal to 10 µm and less than or equal to 500 µm (see FIGS. 2A to 2D).

Specifically, a stack including a flexible base 210b, a barrier film 210a inhibiting diffusion of impurities, and a resin layer 210c that attaches the flexible base 210b to the barrier film 210a can be used for the first base 210.

<<Second Base 270>>

A material which can be used for the first base 210 and has a light-transmitting property in a region overlapping with the display element can be used for the second base 270. A flexible material can be used for the second base 270. Specifically, a stack including a flexible base 270b, a barrier film 270a that prevents diffusion of impurities, and a resin layer 270c that attaches the barrier film 270a and the flexible base 270b can be used as the second base 270.

<<Bonding Layer 205>>

For the bonding layer 205, it is possible to use a material which can bond the first base 210 to the second base 270.

For the bonding layer 205, an inorganic material, an organic material, a composite material of an inorganic material and an organic material, or the like can be used.

For example, a glass layer with a melting point of 400° C. or lower, preferably 300° C. or lower, an adhesive, or the like can be used.

For example, an organic material such as a light curable adhesive, a reactive curable adhesive, a thermosetting adhesive, and/or an anaerobic adhesive can be used for the bonding layer 205.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin, or the like can be used.

<<Insulating Layer 290>>

A material having an electrically insulating property or a material that suppresses impurity diffusion can be used for the insulating layer 290. For example, an oxide, a nitride, a fluoride, a sulfide, a ternary compound, a metal, or a polymer can be used for the insulating layer 290.

For example, a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like can be used.

For example, a material containing aluminum nitride, hafnium nitride, silicon nitride, tantalum nitride, titanium nitride, niobium nitride, molybdenum nitride, zirconium nitride, gallium nitride, or the like can be used.

For example, a material containing copper, platinum, ruthenium, tungsten, iridium, palladium, iron, cobalt, nickel, or the like can be used.

For example, a material containing zinc sulfide, strontium sulfide, calcium sulfide, lead sulfide, calcium fluoride, strontium fluoride, zinc fluoride, or the like can be used.

For example, a material that includes a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like can be used.

For example, a material that can be formed by an atomic layer deposition (ALD) method can be used for the insulating layer 290. The dense insulating layer 290 having reduced defects such as cracks or pinholes or a uniform thickness can be formed by an ALD method. Furthermore, damage caused to the processed member in forming the insulating layer 290 can be reduced.

<<Functional Layer>>

For example, a functional circuit, a functional element, an optical element, a functional film, or a layer including a plurality of elements selected from these can be used as the functional layer.

For example, an electric element or a biochip can be used for the functional layer. Specifically, a transistor, a capacitor, a resistor, a memory element, a light-emitting element, a display element, or the like can be used.

For example, a display element and a pixel circuit for driving the display element can be used for the functional layer.

For example, a touch sensor, a color filter, a moisture-proof film, or the like can be used as the functional layer.

<<Region 201>>

The region 201 includes a plurality of functional elements. For example, the region 201 includes functional elements arranged in a matrix. Specifically, the region 201 includes the plurality of pixels 202 arranged in a matrix. Thus, the functional panel 200 can display image data on the region 201.

<<Pixel 202>>

A plurality of subpixels can be used in the pixel 202. For example, the subpixel 202R which displays red, a subpixel which displays green, and a subpixel which displays blue can be used. Furthermore, subpixels or the like which display yellow, white, cyan, and magenta can be used.

<<Subpixel>>

A display element and a pixel circuit for driving the display element can be used in a subpixel.

The insulating film 221 can be provided between the functional layer including a display element and the functional layer including a pixel circuit.

For example, an inorganic material, an organic material, or a composite material of an inorganic material and an organic material can be used for the insulating film 221. Specifically, a film containing silicon and nitrogen, a film containing silicon and oxygen, a film containing polyimide, a film containing an acrylic resin, a film containing a silicone resin, a film in which a plurality of films selected from these films are stacked, or the like can be used as the insulating film 221.

Note that the functional panel 200 includes the light-blocking layer 267BM having an opening in the region overlapping with the subpixel 202R. The light-blocking layer 267BM has a light-blocking property.

For example, a resin in which a pigment is dispersed, a resin containing a dye, or an inorganic film such as a black chromium film can be used for the light-blocking layer 267BM. Specifically, carbon black, an inorganic oxide, a composite oxide containing a solid solution of a plurality of inorganic oxides, or the like can be used for the light-blocking layer 267BM.

Note that the partition 228 having an opening in a region overlapping with the display element can be used in the functional panel 200. For example, a region of a conductive film over which the partition 228 is provided, which overlaps with the opening of the partition 228 can be used as the lower electrode of the light-emitting element 250R. Thus, a step can be prevented from being generated at the end portion of the lower electrode.

<<Display Element>>

For example, display media whose contrast, luminance, reflectivity, transmittance, or the like is changed by electrical or magnetic effect can be used as a display element.

Note that the display module 280R including the light-emitting element 250R and the coloring layer 267R which transmits at least part of light emitted from the light-emitting element 250R can be used as the display element.

For example, a layer containing a material such as a pigment or a dye can be used as the coloring layer 267R. Accordingly, the display module 280R can emit light of a particular color.

A microcavity structure in which the light-emitting element 250R is provided between a reflective film and a semi-transmissive and semi-reflective film can be used. Specifically, it is possible to use the light-emitting element 250R one electrode of which is a reflective conductive film and the other electrode of which is a semi-transmissive and semi-reflective conductive film.

For example, a microresonator for extracting red light efficiently and a coloring layer which transmits red light may be used in the display module 280R for displaying red, a microcavity for extracting green light efficiently and a coloring layer which transmits green light may be used in a display module for displaying green, or a microcavity for extracting blue light efficiently and a coloring layer which transmits blue light may be used in a display module for displaying blue light.

Note that a microcavity for extracting yellow light efficiently and a coloring layer which transmits yellow light may be used in a display module.

Specifically, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric ceramic display, a display element including a carbon nanotube, or the like can be used.

<<Pixel Circuit>>

A variety of pixel circuits suitable for the display element can be used.

For example, a pixel circuit including the driving transistor MO or the capacitor C can be used.

A variety of transistors can be used as the driving transistor MO.

For example, a transistor in which a Group 14 element, a compound semiconductor, an oxide semiconductor, or the like is used for the semiconductor layer can be used. Specifically, a semiconductor containing silicon, a semiconductor containing gallium arsenide, an oxide semiconductor containing indium, or the like can be used for the semiconductor layer of the driving transistor MO.

For example, single crystal silicon, polysilicon, amorphous silicon, or the like can be used for the semiconductor layer of the driving transistor MO.

For example, a bottom-gate transistor, a top-gate transistor, or the like can be used.

⟨⟨Driver Circuit⟩⟩

A variety of sequential circuit such as a shift register can be used as the driving circuit GD or the driving circuit SD.

A variety of transistors can be used as the transistor MD of the driver circuit SD. For example, a structure which can be formed in the same process as the driving transistor MO can be used for the transistor MD.

The capacitor CD can have the same structure as the capacitor C.

<<Wiring and Terminal>>

A conductive material can be used for the wiring 211 or the terminal 219.

For example, an inorganic conductive material, an organic conductive material, a metal material, a conductive ceramic material, or the like can be used for the wiring 211 or the terminal 219.

Specifically, a metal element selected from aluminum, gold, platinum, silver, chromium, tantalum, titanium, molybdenum, tungsten, nickel, iron, cobalt, palladium, and manganese; an alloy including any of the above-described metal elements; an alloy including any of the above-described metal elements in combination; or the like can be used for the wiring 211 or the terminal 219.

Alternatively, a conductive oxide such as indium oxide, indium tin oxide, indium zinc oxide, zinc oxide, or zinc oxide to which gallium is added can be used for the wiring 211 or the terminal 219.

Graphene or graphite can be used for a conductive film. The film including graphene can be formed, for example, by reducing a film including graphene oxide. As a reducing method, a method using heat, a method using a reducing agent, or the like can be employed.

Alternatively, a conductive polymer can be used.

Note that the terminal 219 can be electrically connected to the flexible printed circuit 209, for example, with an anisotropic conductive film.

<<Others>>

The functional panel 200 includes the functional film 267p.

For example, an inorganic material, an organic material, or a composite material of an inorganic material and an organic material can be used for the functional film 267p. Specifically, a ceramic coat layer containing alumina, silicon oxide, or the like, a hard coat layer containing a UV curable resin or the like, an anti-reflection film, a circularly polarizing plate, or the like can be used for the functional film 267p.

⟨⟨Transistor⟩⟩

A variety of transistors can be used as the driving transistor MO or the transistor MD.

For example, a bottom-gate transistor can be used as the driving transistor MO or the transistor MD.

For example, a semiconductor layer containing an oxide semiconductor, amorphous silicon, or the like can be used in the driving transistor MO and the transistor MD.

For example, a film represented by an In-M-Zn oxide that contains at least indium (In), zinc (Zn), and M (M is a metal such as Al, Ga, Ge, Y, Zr, Sn, La, Ce, or Hf) is preferably included. Alternatively, both In and Zn are preferably contained.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As an oxide semiconductor included in an oxide semiconductor film, any of the followings can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, and an In—Ga-based oxide. Note that here, for example, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

For example, a semiconductor layer containing polycrystalline silicon that is obtained by crystallization process such as laser annealing can be used in the driving transistor MO and the transistor MD (see FIG. 1C).

For example, a top-gate transistor can be used as the driving transistor MO and the transistor MD (see FIG. 1D).

For example, a semiconductor layer containing polycrystalline silicon, or a semiconductor layer including a single crystal silicon film that is transferred from a single crystal silicon substrate, or the like can be used in the driving transistor MO and the transistor MD.

Another structure of a functional panel of one embodiment of the present invention will be described with reference to FIGS. 17A to 17D, FIGS. 18A to 18D, FIGS. 19A to 19D, FIGS. 20A to 20D, FIGS. 21A to 21D, and FIGS. 22A to 22D.

FIGS. 17A to 17D, FIGS. 18A to 18D, FIGS. 19A to 19D, FIGS. 20A to 20D, FIGS. 21A to 21D, and FIGS. 22A to 22D each illustrate a structure of a functional panel of one embodiment of the present invention. FIG. 17A, FIG. 18A, FIG. 19A, FIG. 20A, FIG. 21A, and FIG. 22A are top views of functional panels of embodiments of the present invention. FIG. 17B, FIG. 18B, FIG. 19B, FIG. 20B, FIG. 21B, and FIG. 22B are cross-sectional views taken along lines A-B and C-D in FIG. 17A, FIG. 18A, FIG. 19A, FIG. 20A, FIG. 21A, and FIG. 22A, respectively. FIG. 17C, FIG. 18C, FIG. 19C, FIG. 20C, FIG. 21C, and FIG. 22C and FIG. 17D, FIG. 18D, FIG. 19D, FIG. 20D, FIG. 21D, and FIG. 22D are cross-sectional views illustrating structures in which the structures of FIG. 17B, FIG. 18B, FIG. 19B, FIG. 20B, FIG. 21B, and FIG. 22B are partly changed.

Figure 17A:
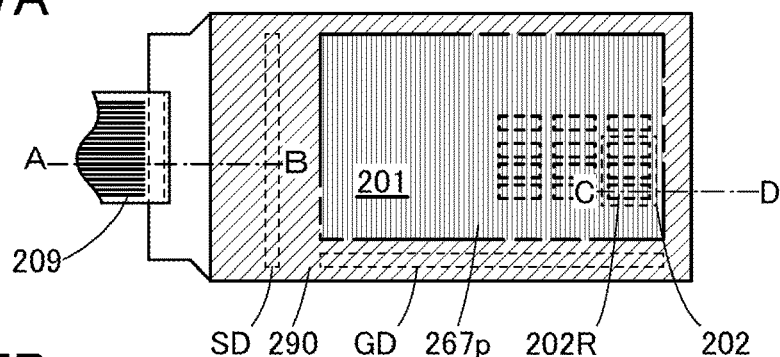
FIGS. 17A to 17D are diagrams illustrating structures of a functional panel of one embodiment.
Figure 17B:
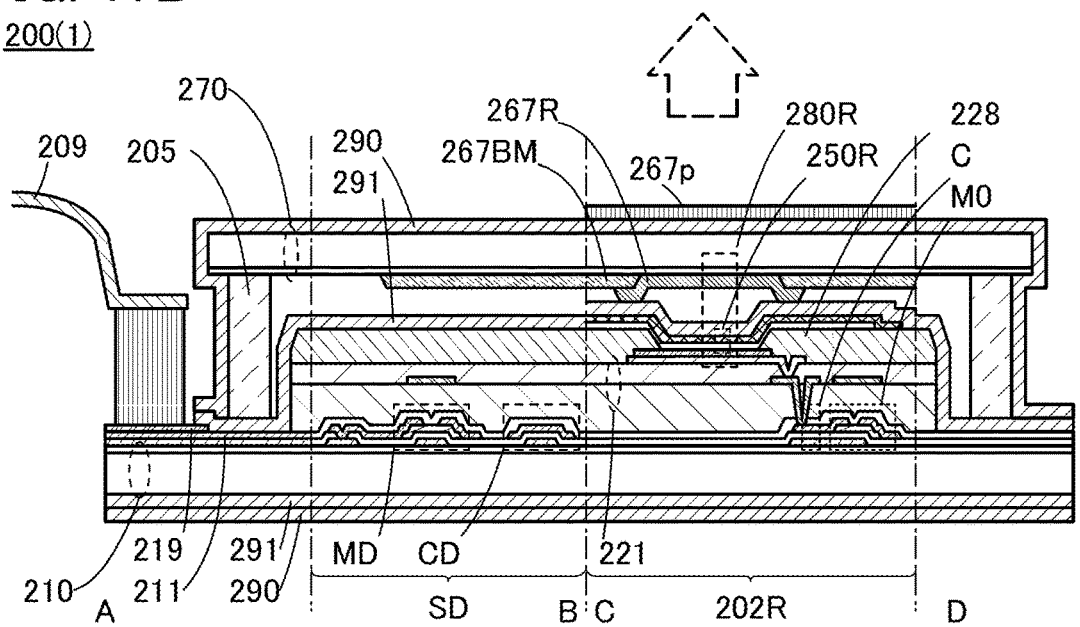
Figure 17C:
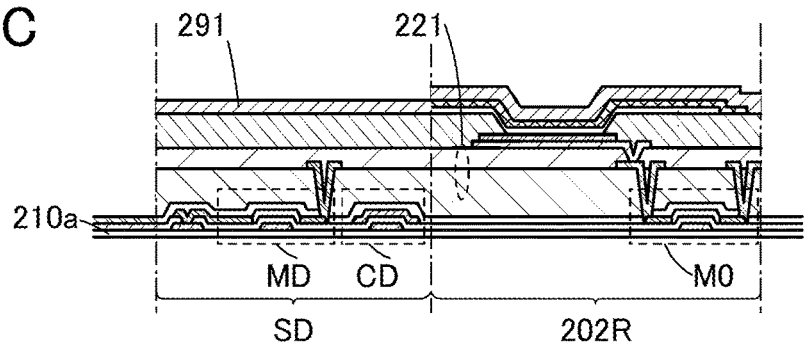
Figure 17D:
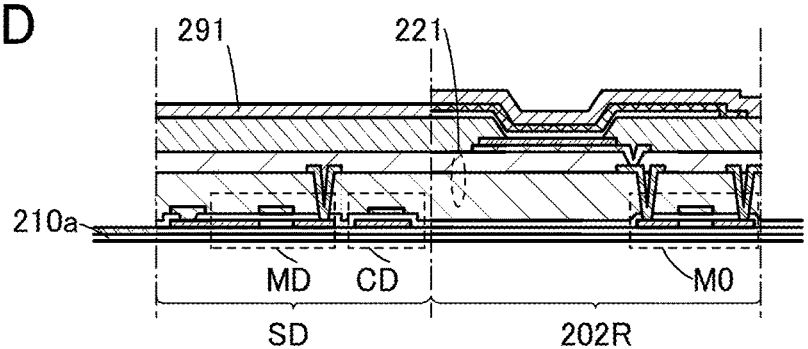
Figure 18A:
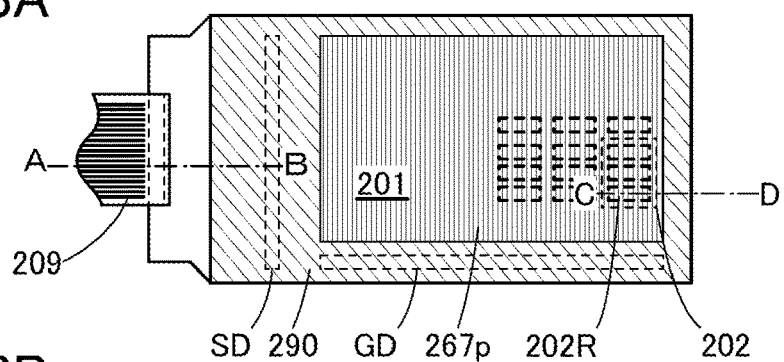
FIGS. 18A to 18D are diagrams illustrating structures of a functional panel of one embodiment.
Figure 18B:
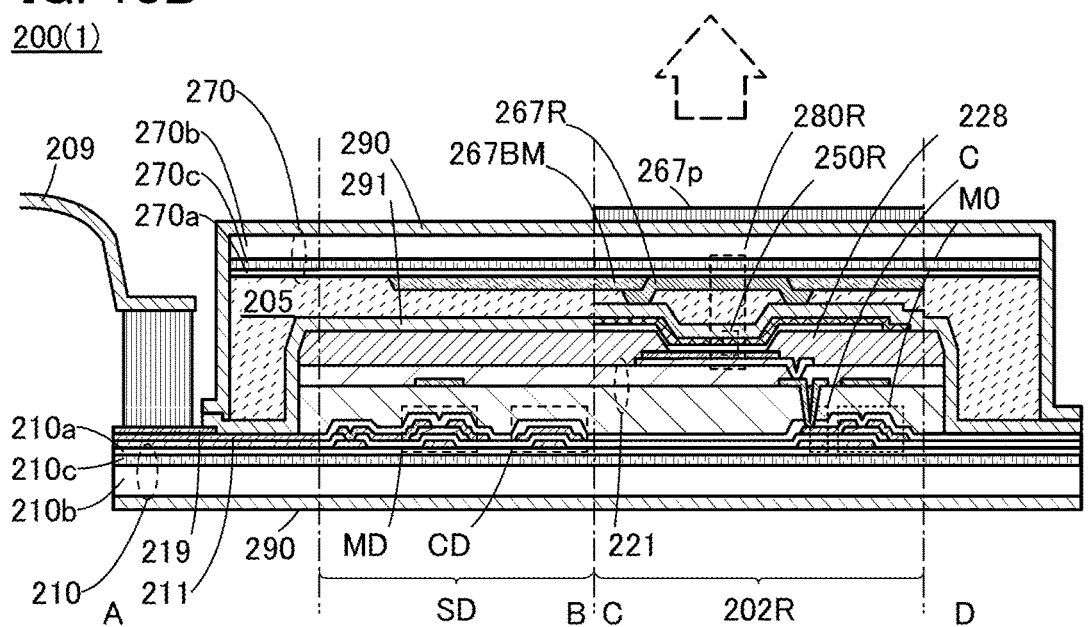
Figure 18C:
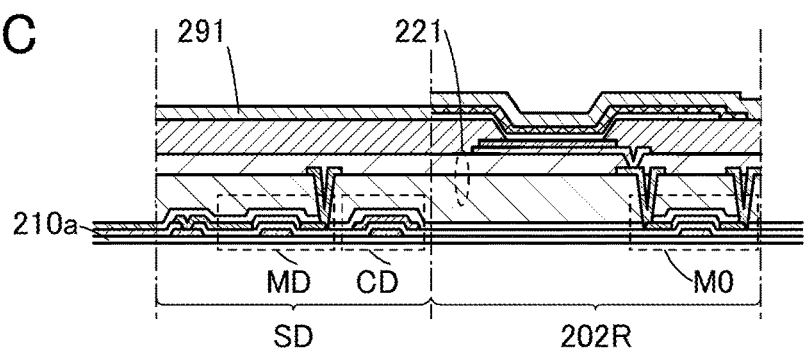
Figure 18D:
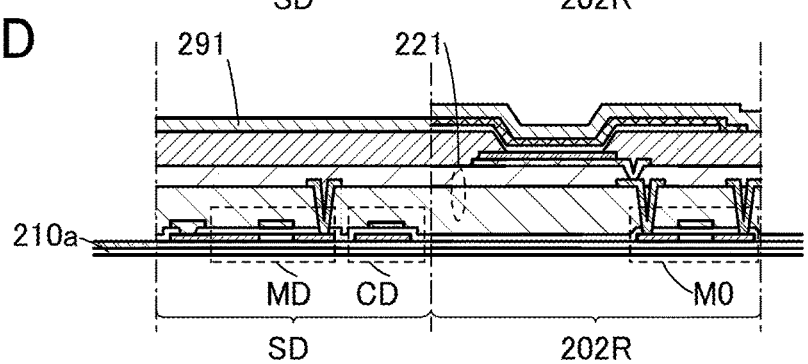
Figure 19A:
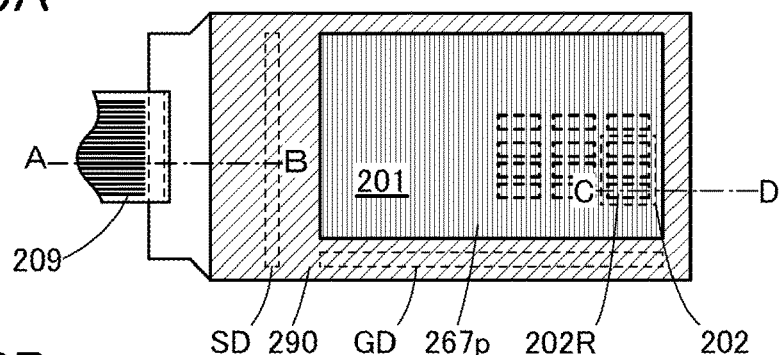
FIGS. 19A to 19D are diagrams illustrating structures of a functional panel of one embodiment.
Figure 19B:
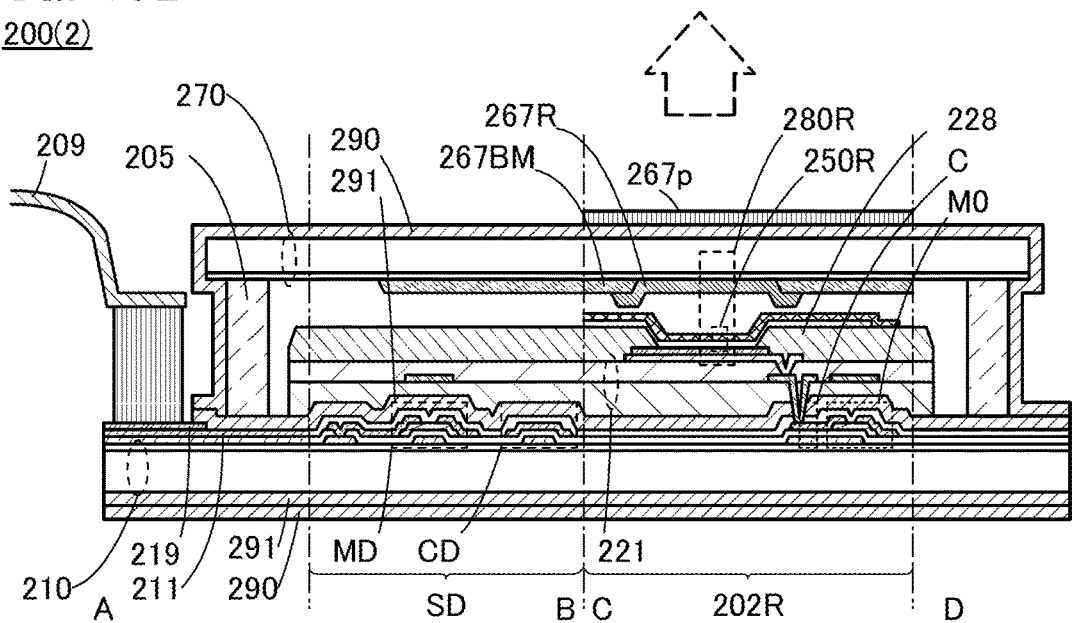
Figure 19C:
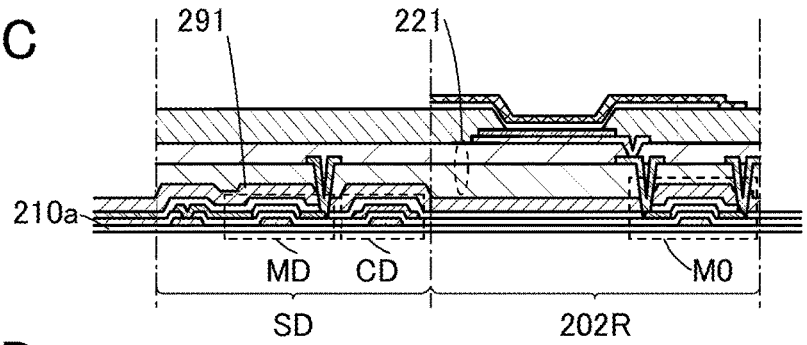
Figure 19D:
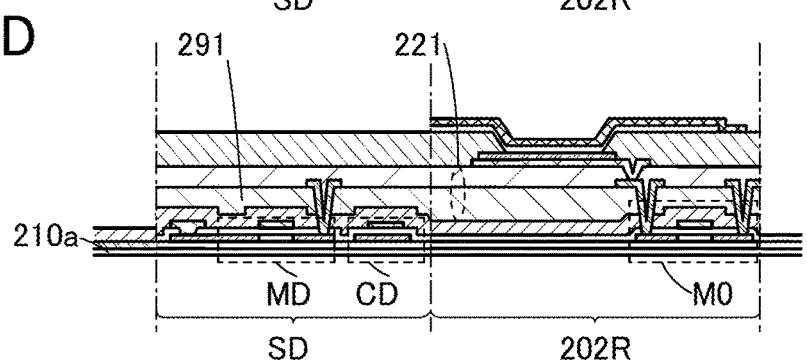
Figure 20A:
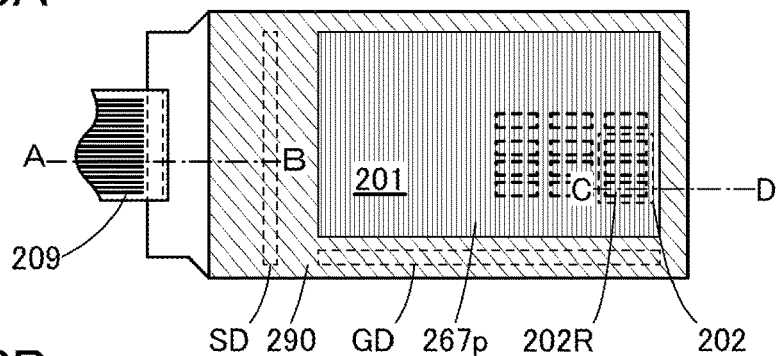
FIGS. 20A to 20D illustrate structures of a functional panel of one embodiment.
Figure 20B:
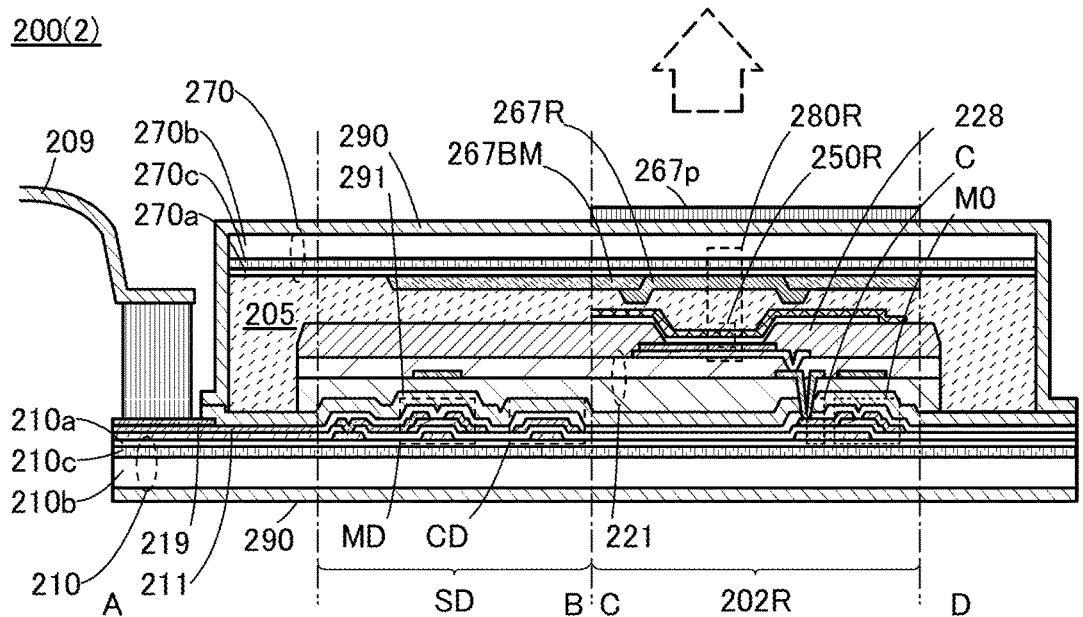
Figure 20C:
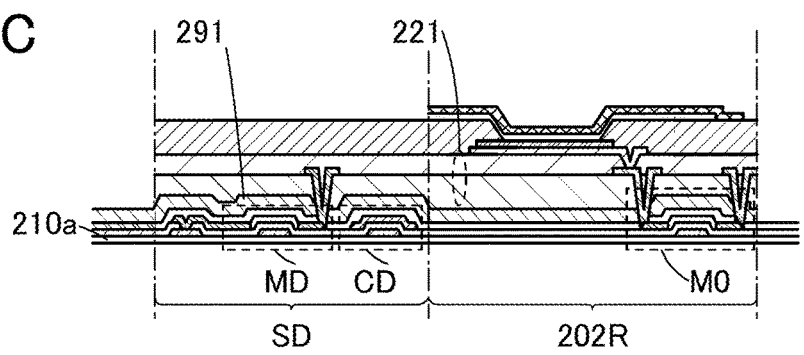
Figure 20D:
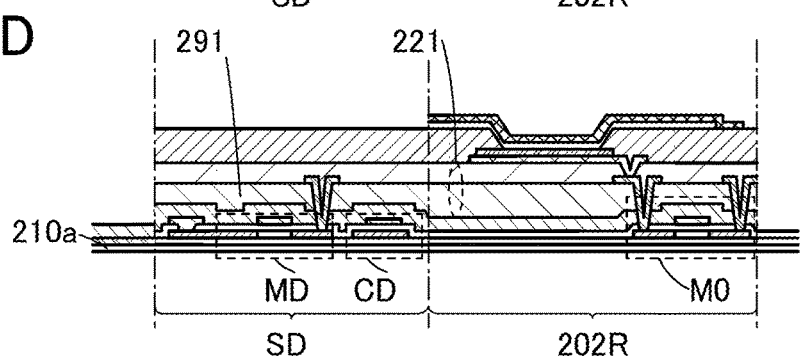
Figure 21A:
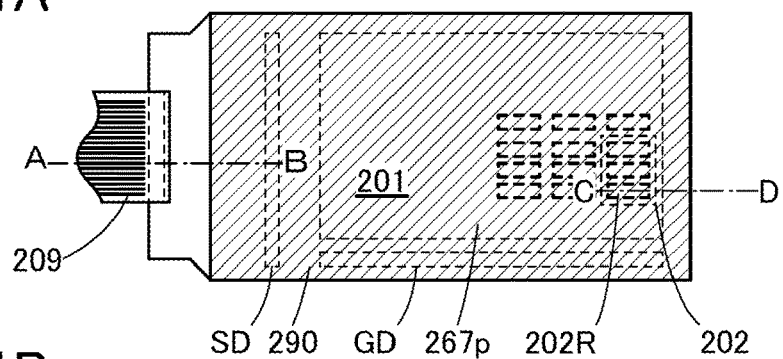
FIGS. 21A to 21D illustrate structures of a functional panel of one embodiment.
Figure 21B:
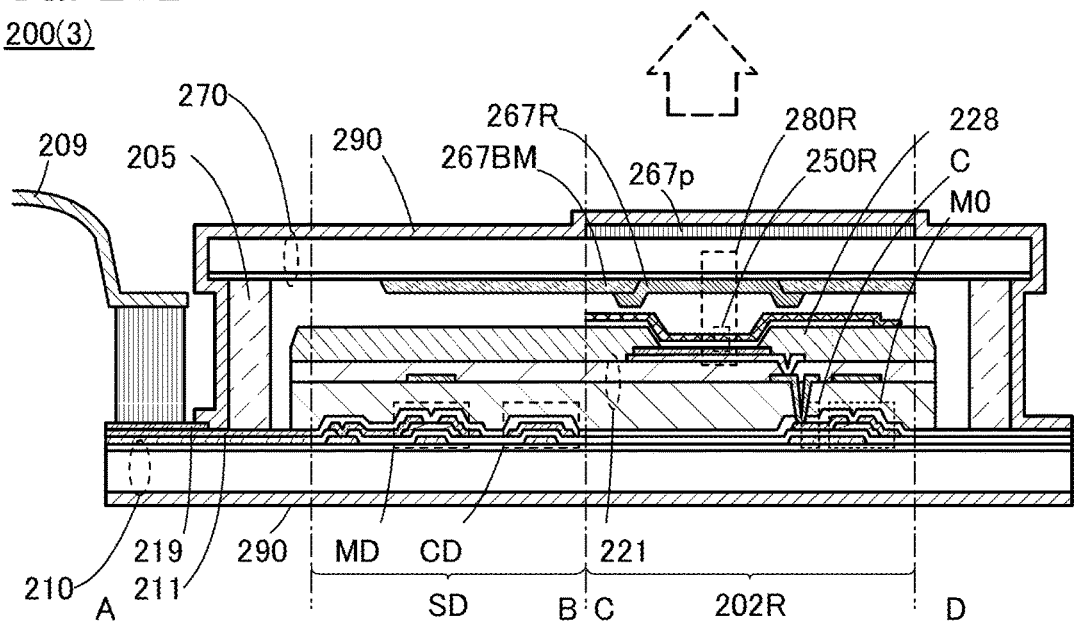
Figure 21C:
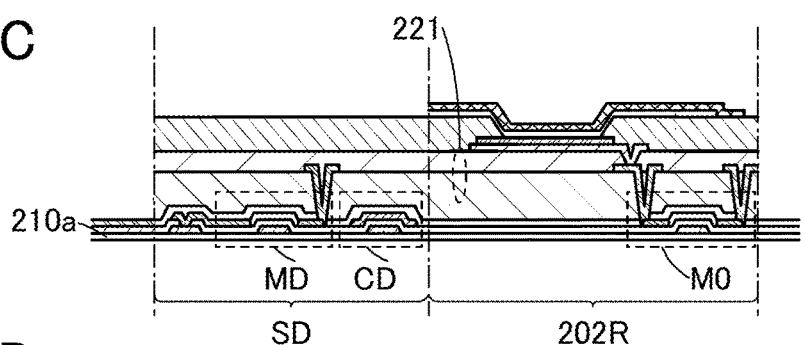
Figure 21D:
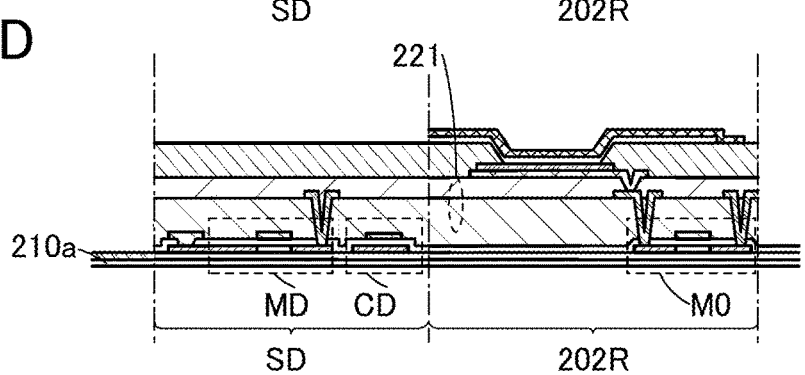
Figure 22A:
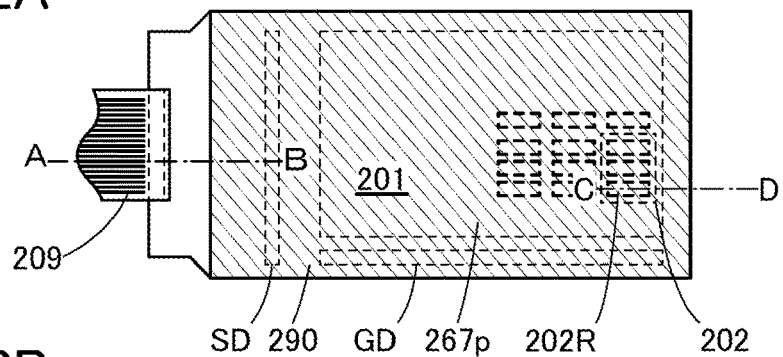
FIGS. 22A to 22D illustrate structures of a functional panel of one embodiment.
Figure 22B:
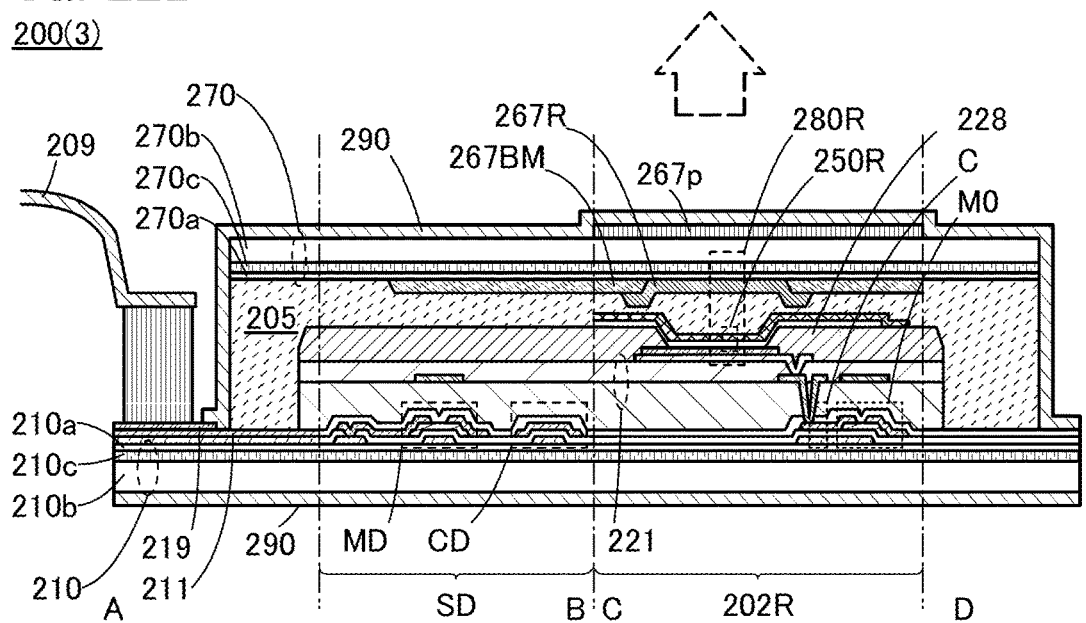
Figure 22C:
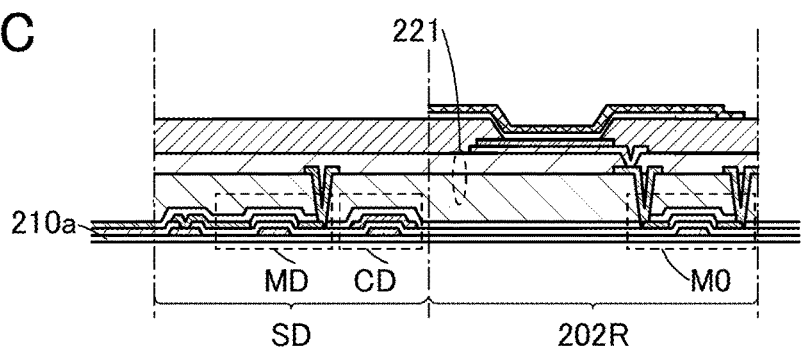
Figure 22D:
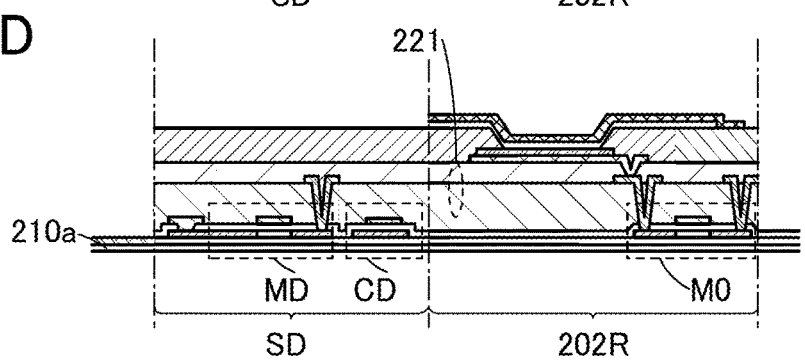

A functional panel 200(1) differs from the functional panel 200 in that the functional panel 200(1) includes an insulating layer 291 and that the light-emitting element 250R is provided between the insulating layer 291 and the first base 210 (see FIGS. 17B and 18B).

A material which can be used for the insulating layer 290 can be used for the insulating layer 291. The insulating layer 291 can be formed by a method similar to that used for the insulating layer 290.

A functional panel 200(2) differs from the functional panel 200 in that the functional panel 200(2) includes the insulating layer 291 and that the driving transistor MO is provided between the insulating layer 291 and the first base 210 (see FIGS. 19A to 19D and FIGS. 20A to 20D).

A material which can be used for the insulating layer 290 can be used for the insulating layer 291. The insulating layer 291 can be formed by a method similar to that used for the insulating layer 290.

A functional panel 200(3) differs from the functional panel 200 in including the functional film 267p between the insulating layer 290 and the second base 270 (see FIGS. 21A to 21D and FIGS. 22A to 22D).

<Structure Example 2 of Functional Panel>

Another structure of a functional panel of one embodiment of the present invention will be described with reference to FIGS. 3A to 3D.

Figure 3A:
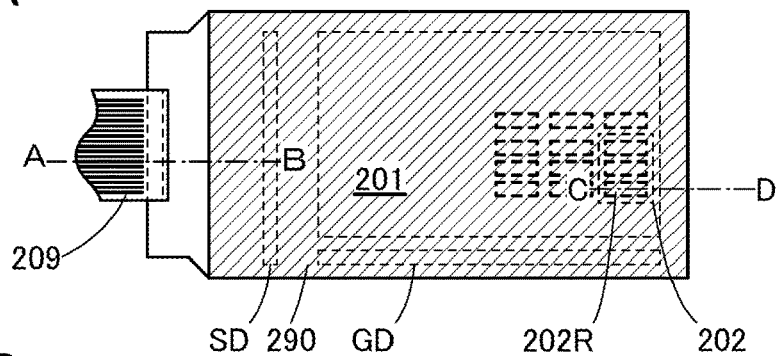
FIGS. 3A to 3D illustrate structures of a functional panel of one embodiment.
Figure 3B:
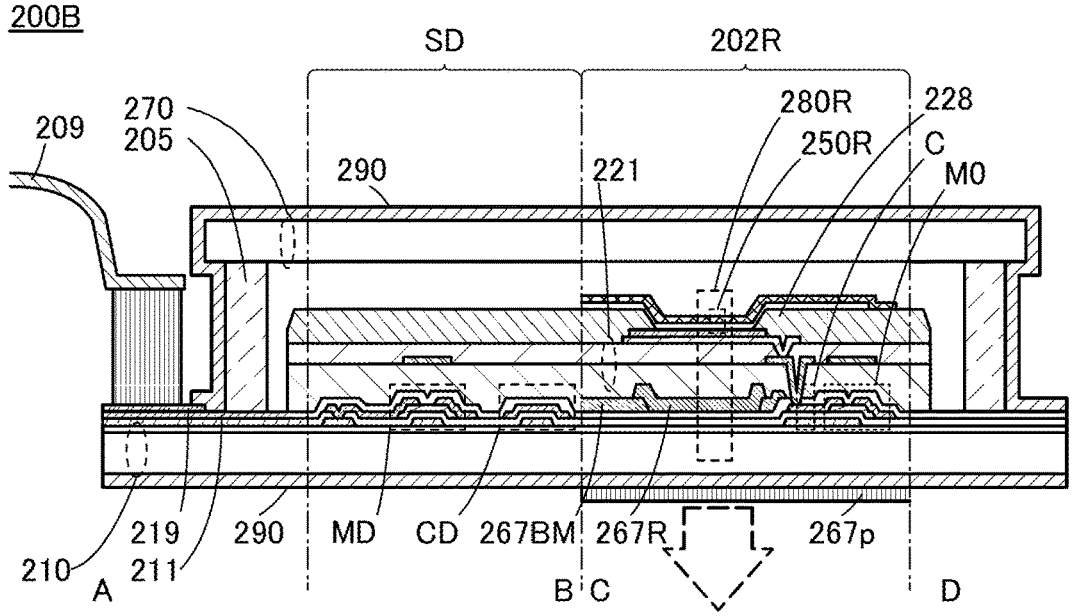
Figure 3C:
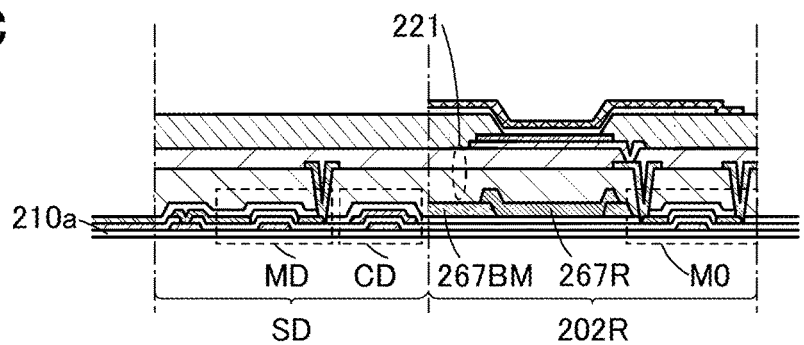
Figure 3D:
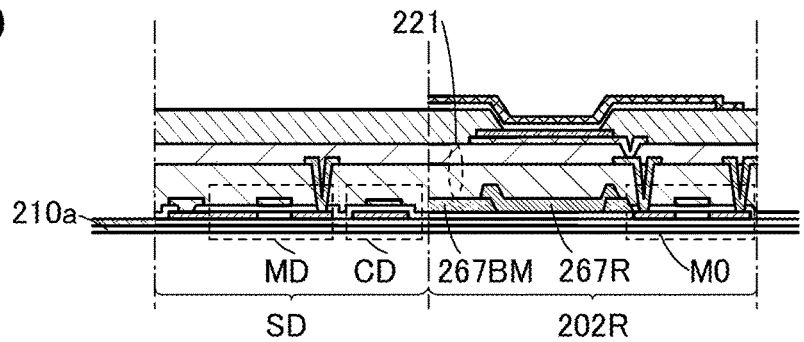
Figure 4A:
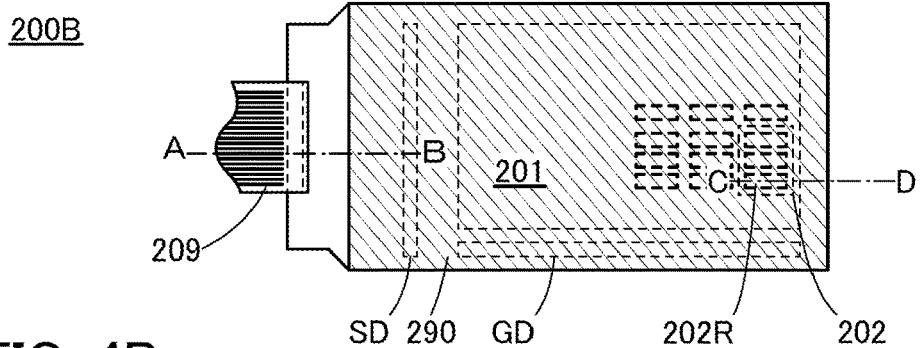
FIGS. 4A to 4D illustrate structures of a functional panel of one embodiment.
Figure 4B:
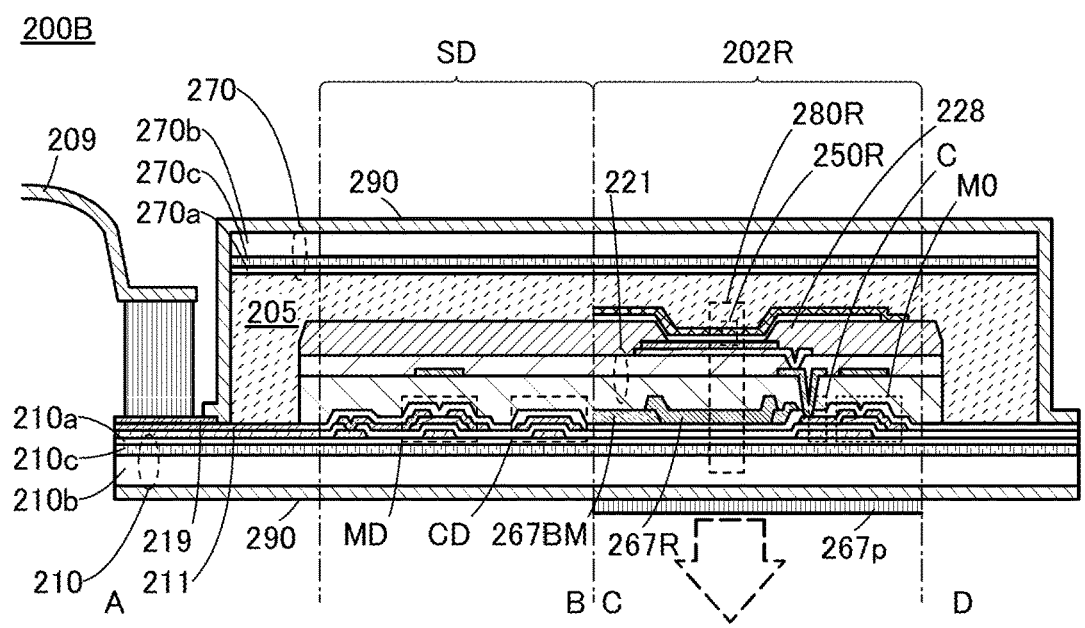
Figure 4C:
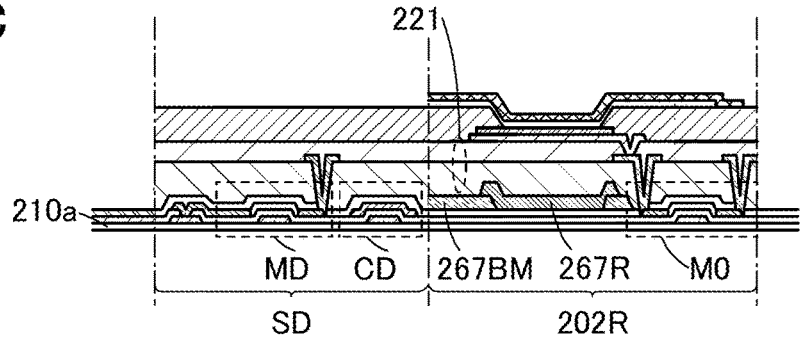
Figure 4D:
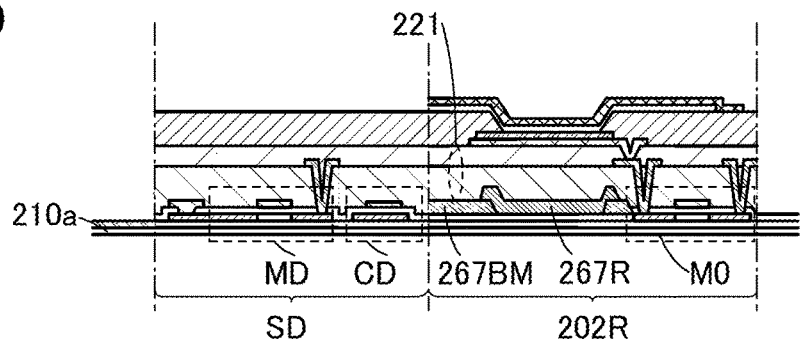

FIGS. 3A to 3D illustrate structures of a functional panel of one embodiment of the present invention. Note that FIG. 3A is a top view of a functional panel 200B of one embodiment of the present invention, and FIG. 3B is a cross-sectional view taken along the lines A-B and C-D in FIG. 3A. FIGS. 3C and 3D are cross-sectional views each illustrating a structure in which part of the structure of FIG. 3B is changed.

The functional panel 200B described in this embodiment differs from the functional panel 200 in FIGS. 1A to 1D in that the light-blocking layer 267BM having an opening in the region overlapping with the subpixel 202R and the coloring layer 267R are provided between the first base 210 and the light-emitting element 250R, in that the functional film 267p is provided on the first base 210 side, and in that the display module 280R emits light toward the first base 210 side.

The first base 210 has a light-transmitting property in a region overlapping with the display element. The second base 270 does not necessarily have a light-transmitting property. As the other components, similar components can be used.

Accordingly, the functional panel 200B can display data on the side where the first base 210 is provided.

Note that a flexible material can be used for the first base 210 and the second base 270. For example, a material having flexibility high enough to be bent or be folded can be used. Specifically, a stack including a flexible base 210b, a barrier film 210a that prevents diffusion of impurities, and a resin layer 210c that attaches the flexible base 210b to the barrier film 210a can be used as the first base 210. A stack including a flexible base 270b, a barrier film 270a that prevents impurity diffusion, and the resin layer 270c that attaches the flexible base 270b and the barrier film 270a can be used as the second base 270 (see FIGS. 4A to 4D).

This embodiment can be combined with any of the other embodiments in this specification as appropriate.

Embodiment 2

In this embodiment, a method for manufacturing a functional panel of one embodiment of the present invention is described with reference to FIG. 5, FIGS. 6A1, 6A2, 6B1, and 6B2, FIG. 7, and FIGS. 8A1, 8A2, 8B1, 8B2, 8C1, 8C2, 8D1, and 8D2.

Figure 5:
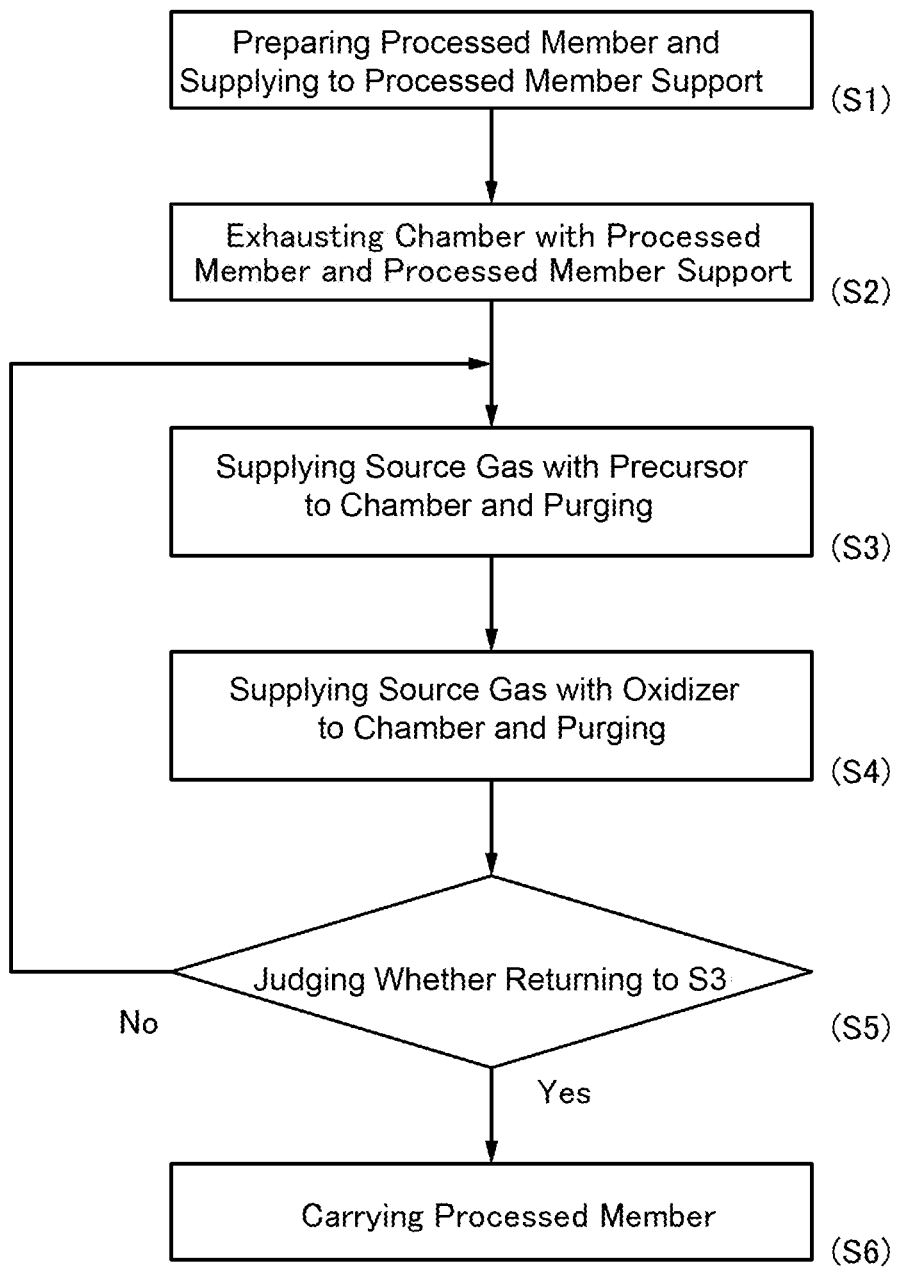
FIG. 5 is a flow chart showing a method for manufacturing a functional panel of one embodiment.

FIG. 5 is a flow chart showing a method for manufacturing a functional panel of one embodiment of the present invention. FIGS. 6A1, 6A2, 6B1, and 6B2 are schematic views illustrating structures of the processed member in a process. FIG. 6A1 is a schematic top view illustrating a processed member of one embodiment of the present invention, FIG. 6B1 is a schematic top view illustrating the processed member of one embodiment of the present invention and a functional panel using the processed member and FIGS. 6A2 and 6B2 are schematic cross-sectional views taken along lines W1-W2 in the drawings shown on the left side.

<Manufacturing Method Example 1 of Functional Panel>

A method for manufacturing a functional panel in this embodiment includes the following six steps (see FIG. 5).

<<First Step>>

In a first step, a processed member 10 is prepared and is supplied to a processed member support which is not shown in the figure (see FIG. 5 (S1)). Note that the processed member support is configured to control the temperature of the processed member 10.

Note that the processed member 10 includes a first base 310, a second base 370 having a region overlapping with the first base 310, a bonding layer 305 that bonds the second base 370 to one of surfaces of the first base 310, and a functional layer 330 located in a region surrounded by the first base 310, the second base 370, and the bonding layer 305. The functional layer 330 includes a plurality of functional elements (see FIGS. 6A1 and 6A2).

<<Second Step>>

In a second step, for example, the temperature of the processed member 10 is controlled with the processed member support to have a predetermined value, and a chamber (not illustrated) which includes the processed member 10 and the processed member support is exhausted (see FIG. 5 (S2)). Note that the chamber has a space which can be sealed.

<<Third Step>>

In a third step, a source gas containing a precursor compound is supplied to the chamber, and is then purged from the chamber (see FIG. 5 (S3)). For example, metal alkoxide, an organic metal compound, or the like can be used as a precursor compound. Note that as a method for purging the source gas, a method of exhausting the chamber, a method of exhausting the chamber while an inert gas is introduced, or the like can be used.

<<Fourth Step>>

In a fourth step, a source gas containing an oxidizer is supplied to the chamber, and is then purged from the chamber (see FIG. 5 (S4)). For example, water vapor, ozone, or the like can be used as an oxidizer. Note that when this step is terminated, an insulating layer containing an oxide of a precursor compound is formed on a surface of the processed member 10. By this method, a dense film can be formed on a surface having a complicated shape. As a result, an insulating layer having few defects such as pinholes can be formed.

<<Fifth Step>>

In a fifth step, in the case where the number of repeated cycles each including the third step and the fourth step is less than a predetermined number of repeated cycles, the process returns to the third step. In the case where the number of repeated cycles is greater than or equal to a predetermined number of repeated cycles, the process proceeds to a sixth step (see FIG. 5 (S5)). Note that a unit of repetition includes one cycle, and one cycle includes the third step and the fourth step.

Note that a method of alternately supplying two or more precursor compounds can be used in the third step. For example, in the third step, a step of supplying a source gas containing a first precursor compound and a step of supplying a source gas containing a second precursor compound can be performed. In this case, one cycle includes the third step including the above two steps and the fourth step.

<<Sixth Step>>

In a sixth step, the processed member 10 is carried out of the chamber. Here, formation of an insulating layer 390 is terminated (see FIG. 5(S6) and FIGS. 6B1 and 6B2). Note that when this step is terminated, a functional panel 300 in which the insulating layer 390 containing an oxide of a precursor compound is formed with a predetermined thickness on a surface can be provided.

The method for manufacturing a functional panel described in this embodiment includes a step of supplying a source gas containing a precursor compound and then purging the source gas from the chamber; and a step of supplying a source gas containing an oxidizer and then purging the source gas from the chamber. Thus, the insulating layer containing an oxide of the precursor compound can be formed on a surface of the processed member. As a result, a novel method for manufacturing a functional panel can be provided.

A method for manufacturing a functional panel described in this embodiment can be implemented, for example, with any of film formation systems of embodiments of the present invention, which is described in Embodiment 3.

Specifically, in a film formation apparatus 100, a functional layer is formed over the first base 310, and in a sealing chamber SU, the first base 310 and the second base 370 are bonded to each other with the bonding layer 305, and thus the first base 310 can be manufactured.

Then, the insulating layer 390 can be formed by an atomic layer deposition (ALD) apparatus.

As a method for forming a region where the insulating layer 390 is not formed in part of the processed member 10, a lift-off method or the like can be employed.

For example, as the processed member 10, a processed member in which a resist mask capable of being separated in a later step is formed in the region where the insulating layer 390 is not formed is used.

After the first to sixth steps are performed, the resist mask is removed. Thus, the insulating layer 390 formed over the resist mask can be separated from the processed member 10 together with the resist mask.

Specifically, a photosensitive resist, a soluble resin, an adhesive tape, or the like can be used for the resist mask.

<Manufacturing Method Example 2 of Functional Panel>

Another example of the method for manufacturing a functional panel of one embodiment of the present invention will be described with reference to FIG. 7 and FIGS. 8A1, 8A2, 8B1, 8B2, 8C1, 8C2, 8D1, and 8D2.

FIG. 7 is a flow chart showing a method for manufacturing a functional panel of one embodiment of the present invention. FIGS. 8A1, 8A2, 8B1, 8B2, 8C1, 8C2, 8D1, and 8D2 are schematic views illustrating a structure of the processed member in a process. FIGS. 8A1, 8B1, 8C1 and 8D1 are schematic top views illustrating a processed member of one embodiment of the present invention, and FIGS. 8A2, 8B2, 8C2 and 8D2 are schematic cross-sectional views taken along line W1-W2 in the drawings shown on the left side.

Another method for manufacturing a functional panel in this embodiment includes the following eight steps (see FIG. 7). Note that the method for manufacturing a functional panel described in this embodiment can be implemented, for example, with any of film formation systems of embodiments of the present invention, which is described in Embodiment 3.

The method for manufacturing a functional panel in FIG. 7 differs from the method in FIG. 5 in the following three points.

A first point is that a processed member 10B is used. The processed member 10B includes a first bonding layer 305a; a second bonding layer 305b; a first functional layer 330a located in a region surrounded by the first base 310, the second base 370, and the first bonding layer 305a; and a second functional layer 330b located in a region surrounded by the first base 310, the second base 370, and the second bonding layer 305b (FIGS. 8A1 and 8A2).

A second point is that the method in FIG. 7 includes a step of forming an opening in a region overlapping with a region between the first bonding layer 305a and the second bonding layer 305b in the second base 370 (see FIG. 7 (T1) and FIGS. 8B1 and 8B2).

A third point is that the method in FIG. 7 includes a step of dividing the processed member 10B along the region overlapping with the region between the first bonding layer 305a and the second bonding layer 305b (see FIG. 7 (T8) and FIGS. 8D1 and 8D2).

Thus, different steps will be described in detail below. Refer to the above description for portions where the same steps can be employed.

<<First Step>>

In a first step, the processed member 10B is prepared (see FIGS. 8A1 and 8A2), and an opening is formed in the region of the second base 370 overlapping with the region between the first bonding layer 305a and the second bonding layer 305b (see FIG. 7 (T1) and FIGS. 8B1 and 8B2).

For example, the second base 370 is divided into a second base 370a and a second base 370b to form a continuous opening between the second base 370a and the second base 370b. Alternatively, a plurality of openings may be formed in the form of a dashed line by a method of inserting a sharp tip into the second base 370, a method using a laser or the like (e.g., a laser ablation method), or the like.

<<Second Step>>

In a second step, the processed member 10B is supplied to the processed member support which is not illustrated (see FIG. 7 (T2)).

<<Third Step>>

In a third step, for example, the temperature of the processed member 10B is controlled to have a predetermined value with the processed member support, and a chamber which includes the processed member support is exhausted (see FIG. 7 (T3)). Note that the chamber has a space which can be sealed.

<<Fourth Step>>

In a fourth step, a source gas containing a precursor compound is supplied to the chamber, and is then purged from the chamber (see FIG. 7 (T4)).

<<Fifth Step>>

In a fifth step, a source gas containing an oxidizer is supplied to the chamber, and then the chamber is exhausted (see FIG. 7 (T5)).

Note that when this step is terminated, an insulating layer containing an oxide of the precursor compound is formed on a surface of the processed member 10B. By this method, a dense film can be formed on a surface having a complicated shape. As a result, an insulating layer having few defects such as pinholes can be formed. For example, the source gases used in the fourth step and the fifth step enter from the opening formed in the first step, so that an insulating layer can be formed inside the opening.

<<Sixth Step>>

In a sixth step, in the case where the number of repeated cycles each including the third step and the fourth step is less than a predetermined number of repeated cycles, the process returns to the fourth step. In the case where the number of repeated cycles is greater than or equal to a predetermined number of repeated cycles, the process proceeds to a seventh step (see FIG. 7 (T6)).

<<Seventh Step>>

In the seventh step, the processed member 10B is carried out of the chamber. Here, formation of the insulating layer 390 is terminated ((see FIG. 7 (T7) and FIGS. 8C1 and 8C2).

<<Eighth Step>>

In an eighth step, the processed member 10B is divided along the region overlapping with the region between the first bonding layer 305a and the second bonding layer 305b (see FIG. 7 (T8) and FIGS. 8D1 and 8D2). Note that when this step is terminated, a first functional panel 300(1) in which the insulating layer 390a containing an oxide of a precursor compound is formed with a predetermined thickness on a surface and a second functional panel 300(2) in which the insulating layer 390b is formed with a predetermined thickness on a surface can be provided.

Note that the first functional panel 300(1) includes a first base 310a, a second base 370a including a region overlapping with the first base 310a, the first bonding layer 305a that bonds the second base 370a to one of surfaces of the first base 310a, and the first functional layer 330a located in a region surrounded by the first base 310a, the second base 370a, and the first bonding layer 305a. The first functional layer 330a includes a plurality of functional elements.

The first functional panel 300(1) includes the first base 310a. Due to the division, the first base 310a has an end surface on which the insulating layer 390a is not formed.

Note that the second functional panel 300(2) includes a first base 310b, a second base 370b including a region overlapping with the first base 310b, the second bonding layer 305b that bonds the second base 370b to one of surfaces of the first base 310b, and the second functional layer 330b located in a region surrounded by the first base 310b, the second base 370b, and the second bonding layer 305b. The second functional layer 330b includes a plurality of functional elements.

The first functional panel 300(2) includes the first base 310b. Due to the division, the first base 310b has an end surface on which the insulating layer 390b is not formed.

The method for manufacturing a functional panel described in this embodiment includes a step of supplying a source gas containing a precursor compound and then purging the source gas from the chamber; and a step of supplying a source gas containing an oxidizer and then purging the source gas from the chamber. Thus, the insulating layer containing an oxide of the precursor compound can be formed on a surface of the processed member. As a result, a novel method for manufacturing a functional panel can be provided.

This embodiment can be combined with any of the other embodiments in this specification as appropriate.

Embodiment 3

In this embodiment, structures of film formation systems which can be used for manufacturing a functional panel of one embodiment of the present invention will be described with reference to FIGS. 9A and 9B and FIGS. 10A and 10B.

Figure 9A:
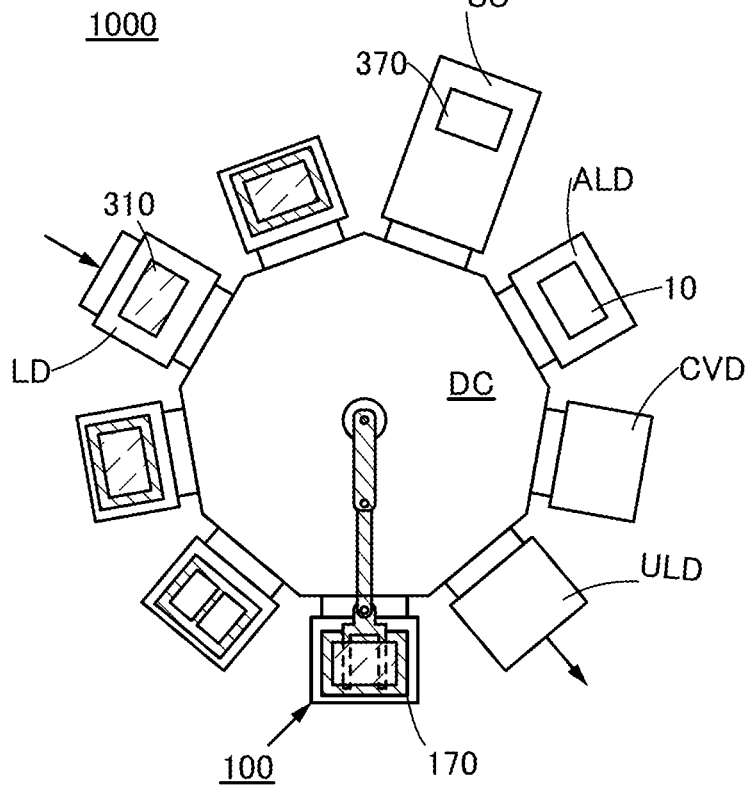
FIGS. 9A and 9B are schematic views each illustrating a film formation system which can be used for manufacturing a functional panel of one embodiment.
Figure 9B:
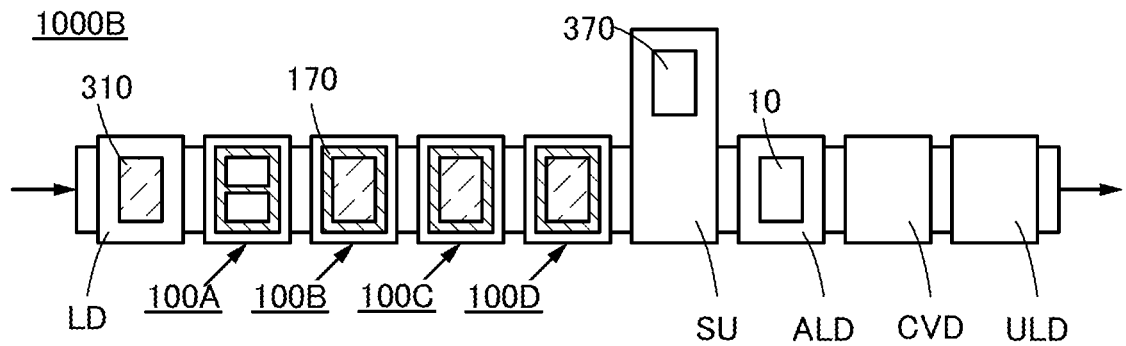

FIGS. 9A and 9B illustrate structures of film formation systems which can be used for manufacturing a functional panel of one embodiment of the present invention. FIG. 9A is a schematic view of a cluster film formation system 1000 of one embodiment of the present invention, and FIG. 9B is a schematic view of an in-line film formation system 1000B of one embodiment of the present invention.

Figure 10A:
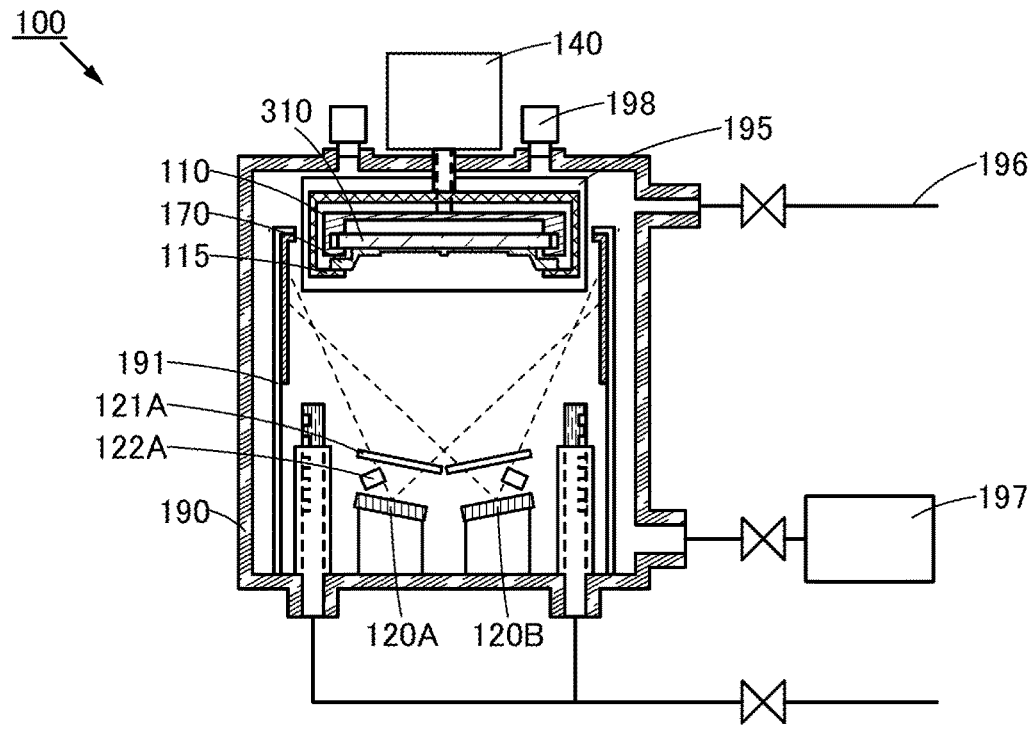
FIGS. 10A and 10B are schematic views each illustrating a structure of a film formation apparatus which can be used for manufacturing a functional panel of one embodiment.
Figure 10B:
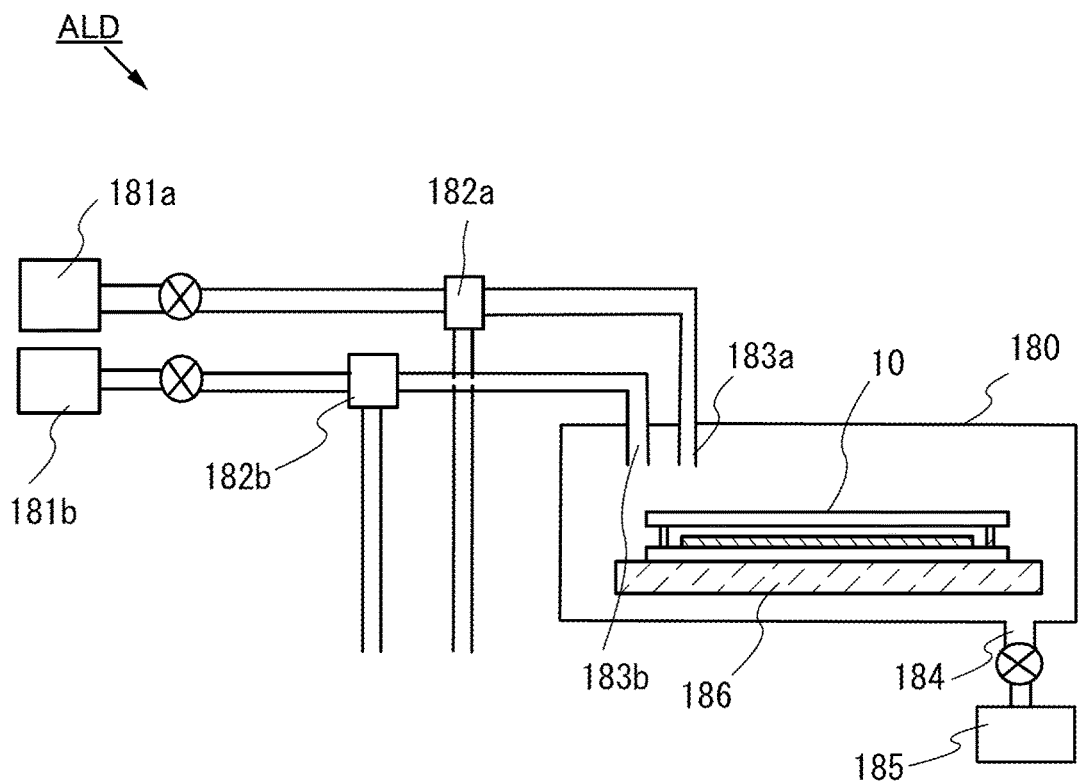

FIGS. 10A and 10B each illustrate a structure of a film formation apparatus which can be used for any of film formation systems of embodiments of the present invention. FIG. 10A is a cross-sectional view illustrating a state where film formation is performed on the first base 310 with a shadow mask 170 and the film formation apparatus 100 which can be used in the film formation system of one embodiment of the present invention, and FIG. 10B is a cross-sectional view illustrating a state where film formation is performed on the processed member 10 by an atomic layer deposition (ALD) apparatus.

<Structure Example 1 of Film Formation System>

The film formation system 1000 includes a loading unit LD, a transfer chamber DC connected to the loading unit LD, an unloading unit ULD connected to the transfer chamber DC, the film formation apparatus 100 connected to the transfer chamber DC, a sealing chamber SU, an atomic layer deposition (ALD) apparatus, and a chemical vapor deposition (CVD) apparatus (see FIG. 9A).

The first base 310 is carried in the loading unit LD. The first base 310 is carried in and out of the transfer chamber DC. The processed member 10 is carried out of the unloading unit ULD.

The first base 310 is carried in the film formation apparatus 100 and a film formation material is deposited over the first base 310.

The first base 310 is carried in the sealing chamber SU, a sealant is formed over the first base 310, and the processed member 10 is carried out of the sealing chamber SU. For example, a bonding layer is formed over the first base 310, the first base 310 and the second base 370 are bonded to each other with the bonding layer, and the sealant is formed.

The processed member 10 is carried in the ALD apparatus, and a film formation material is deposited over the processed member 10.

The processed member 10 is carried in the CVD apparatus, and a film formation material is deposited over the processed member 10.

The film formation apparatus 100, the ALD apparatus, and the CVD apparatus each include a transfer door. The shadow mask 170 is carried in the film formation apparatus 100.

Note that a plurality of film formation apparatuses, ALD apparatuses, and CVD apparatuses may be connected to the transfer chamber DC.

<Structure Example 2 of Film Formation System>

The film formation system 1000B includes the loading unit LD; a film formation apparatus 100A connected to the loading unit LD; a film formation apparatus 100B connected to the film formation apparatus 100A; a film formation apparatus 100C connected to the film formation apparatus 100B; a film formation apparatus 100D connected to the film formation apparatus 100C; the sealing chamber SU connected to the film formation apparatus 100D; the ALD apparatus connected to the sealing chamber SU; the CVD apparatus connected to the ALD apparatus; and the unloading unit ULD connected to the CVD apparatus (see FIG. 9B).

The first base 310 is carried in the loading unit LD. The processed member 10 is carried out of the unloading unit ULD.

The first base 310 is carried in the film formation apparatuses 100A to 100D, a film formation material is deposited over the first base 310, and the first base 310 is carried out of the film formation apparatuses 100A to 100D.

The first base 310 is carried in the sealing chamber SU, a sealant is formed over the first base 310, and the processed member 10 is carried out of the sealing chamber SU. For example, a bonding layer is formed over the first base 310, the first base 310 and the second base 370 are bonded to each other with the bonding layer, and the sealant is formed.

The processed member 10 is carried in the ALD apparatus, a film formation material is deposited over the processed member 10, and the processed member 10 is carried out of the ALD apparatus.

The processed member 10 is carried in the CVD apparatus, a film formation material is deposited over the processed member 10, and the processed member 10 is carried out of the CVD apparatus.

The film formation apparatuses 100A to 100D, the sealing chamber SU, the ALD apparatus, and the CVD apparatus each include a carry-in door and a carry-out door. The shadow mask 170 is carried in the film formation apparatuses 100A to 100D.

Note that in order to prevent attachment of moisture, the units and the apparatuses included in the film formation system 1000 or the film formation system 1000B are preferably filled with an inert gas (such as a nitrogen gas) whose dew point is controlled, more preferably maintain reduced pressure.

The film formation system 1000B described in this embodiment includes the plurality of film formation apparatuses 100A to 100D, the sealing chamber SU, the ALD apparatus, and the CVD apparatus.

Accordingly, a plurality of films can be stacked over the first base 310. Furthermore, a film formation material can be stacked over a previously formed film without exposure of the film to the air. In addition, entry of impurities can be suppressed, and high throughput can be achieved. Moreover, an insulating layer having few pinholes can be formed on the processed member 10 including the first base 310, the second base 370, and the bonding layer which bonds the first base 310 and the second base 370.

Individual components included in the film formation system 1000 or the film formation system 1000B will be described below. Note that these components cannot be clearly distinguished and one component also serves as another component or includes part of another component in some cases.

<<Film Formation Apparatus 100>>

The film formation apparatus 100 described in this embodiment includes a processed member support 110 configured to support the first base 310, an evaporation source 120A configured to eject a film formation material that is to be attached to the first base 310, a shadow mask support 115 which is between the first base 310 and the evaporation source 120A and is configured to support the shadow mask 170, and the film formation chamber 190 including the processed member support 110, the evaporation source 120A, and the shadow mask support 115 (see FIG. 10A).

In addition, the film formation apparatus 100 may include a power mechanism 140. For example, the film formation apparatus 100 may be configured to move the processed member support 110 and the first base 310 relatively to the evaporation source 120A with use of the power mechanism 140. Accordingly, a film formation material ejected from the evaporation source 120A can be uniformly deposited on the surface of the first base 310.

Further, in the film formation apparatus 100, the power mechanism 140 may be used to move the shadow mask support 115 together with the shadow mask 170, the processed member support 110, and the first base 310.

Moreover, the film formation apparatus 100 may include a sensor 198 for sensing the position of the shadow mask 170 relative to the first base 310. For example, the first base 310 is arranged at a predetermined position relative to the shadow mask 170 by being transferred with the processed member support 110 or/and the shadow mask support 115.

The film formation apparatus 100 may also include an evacuation unit 197 for controlling the pressure in the film formation chamber 190 and a pipe 196 for introducing a predetermined gas into the film formation chamber 190.

Furthermore, the film formation apparatus 100 may include a door valve 195 configured to carry the first base 310 or/and the shadow mask 170 in or/and out of the film formation chamber 190.

The film formation apparatus 100 may include an evaporation source 120B as well as the evaporation source 120A. Moreover, the film formation apparatus 100 may include a shielding plate 121A which shields a film formation material ejected from the evaporation source 120A, and a sensor 122A for measuring the amount of film formation material ejected from the evaporation source 120A per unit time.

<<Sealing Chamber SU>>

The sealing chamber SU is configured to bond the first base 310 and the second base 370 with the bonding layer, for example. Thus, the functional layer and the like formed on the surface of the first base 310 is protected with the second base 370.

The sealing chamber SU can be configured to replace the first base 310 with another base. For example, the sealing chamber SU can be configured to separate part of the functional panel formed over the first base 310 from the first base 310 and bond the part of the functional panel to another base. Specifically, an inflexible base can be replaced with a flexible base. Note that in this specification, a base with which the first base 310 has been replaced is also referred to as the first base 310.

<<Atomic Layer Deposition (ALD) Apparatus>>

The ALD apparatus is configured to deposit a variety of film formation materials on the surface of the processed member 10 having a complicated structure on a surface. For example, the ALD apparatus is configured to form a film having a thickness of greater than or equal to 20 nm and less than or equal to 200 nm over the processed member 10.

For example, in the case where a small hole called a pinhole, or the like is formed on the surface of the processed member 10, a film formation material can enter the inside of the pinhole to be deposited, which can fill the pinhole.

In a conventional film formation apparatus utilizing a CVD method, one or a plurality of source material gases for reaction are supplied to a chamber at the same time at the time of film formation. In a film formation apparatus utilizing an ALD method, source material gases for reaction are sequentially introduced into a chamber, and then the sequence of the gas introduction is repeated. For example, two or more kinds of source material gases are sequentially supplied to the chamber by switching respective switching valves (also referred to as high-speed valves). For example, a first source material gas is introduced, an inert gas (e.g., argon or nitrogen) or the like is introduced after the introduction of the first source material gas so that the source material gases are not mixed, and then a second source material gas is introduced. Alternatively, the first source material gas may be exhausted by vacuum evacuation instead of the introduction of the inert gas, and then the second source material gas may be introduced. The first source material gas is adsorbed on a surface of the substrate to form a first single-atomic layer; then the second source material gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute transistor Furthermore, plasma damage is not caused when an ALD method is employed.

FIG. 10B illustrates an example of a film formation apparatus utilizing an ALD method (the film formation apparatus is also referred to as an atomic layer deposition (ALD) apparatus). The ALD apparatus includes a film formation chamber (chamber 180), source material supply portions 181a and 181b, high-speed valves 182a and 182b which are flow rate controllers, source material introduction ports 183a and 183b, a source material exhaust port 184, and an evacuation unit 185. The source material introduction ports 183a and 183b provided in the chamber 180 are connected to the source material supply portions 181a and 181b, respectively, through supply tubes and valves. The source material exhaust port 184 is connected to the evacuation unit 185 through an exhaust tube, a valve, and a pressure controller.

A processed member support 186 with a heater is provided in the chamber, and the first base 310 over which a film is formed is provided over the processed member support 186.

In the source material supply portions 181a and 181b, a source material gas is formed from a solid source material or a liquid source material by using a vaporizer, a heating unit, or the like. Alternatively, the source material supply portions 181a and 181b may supply a gas source material.

Although two source material supply portions 181a and 181b are provided as an example, one embodiment of the present invention is not limited thereto, and three or more source material supply portions may be provided. The high-speed valves 182a and 182b can be accurately controlled by time, and supply one of a source material gas and an inert gas. The high-speed valves 182a and 182b are flow rate controllers for a source material gas, and can be also referred to as flow rate controllers for an inert gas.

In the film formation apparatus illustrated in FIG. 10B, a thin film is formed over a surface of the substrate in the following manner: the processed member 10 is transferred to put on the processed member support 186, the chamber 180 is sealed, the processed member 10 is heated to a desired temperature (e.g., higher than or equal to 80° C., higher than or equal to 100° C., or higher than or equal to 150° C.) with a heater of the processed member support 186 with a heater; and supply of a source material gas, evacuation with the evacuation unit 185, supply of an inert gas, and evacuation with the evacuation unit 185 are repeated.

In the film formation apparatus illustrated in FIG. 10B, an insulating layer formed using an oxide (including a composite oxide) containing one or more elements selected from hafnium, aluminum, tantalum, zirconium, and the like can be formed by selecting a source material (e.g., a volatile organometallic compound) used for the source material supply portions 181a and 181b appropriately. Specifically, it is possible to use an insulating layer formed using hafnium oxide, an insulating layer formed using aluminum oxide, an insulating layer formed using hafnium silicate, or an insulating layer formed using aluminum silicate. Alternatively, a thin film, e.g., a metal layer such as a tungsten layer or a titanium layer, or a nitride layer such as a titanium nitride layer can be formed by selecting a source material (e.g., a volatile organometallic compound) used for the source material supply portions 181a and 181b appropriately.

For example, in the case where a hafnium oxide layer is formed by an ALD apparatus, two kinds of gases, i.e., ozone (O3) as an oxidizer and a source material gas which is obtained by vaporizing liquid containing a solvent and a hafnium precursor compound (a hafnium alkoxide or hafnium amide such as tetrakis(dimethylamide)hafnium (TDMAH)) are used. In this case, the first source material gas supplied from the source material supply portion 181a is TDMAH, and the second source material gas supplied from the source material supply portion 181b is ozone. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide layer is formed by an ALD apparatus, two kinds of gases, e.g., $H_2O$ as an oxidizer and a source material gas which is obtained by vaporizing liquid containing a solvent and an aluminum precursor compound (e.g., trimethylaluminum (TMA)) are used. In this case, the first source material gas supplied from the source material supply portion 181a is TMA, and the second source material gas supplied from the source material supply portion 181b is $H_2O$. Note that the chemical formula of trimethylaluminum is $Al(CH_3)_3$. Examples of another material liquid include tris(dimethylamide)aluminum, triisobutylaluminum, and aluminum tris (2,2,6,6-tetramethyl-3,5-heptanedionate).

In the case where a tungsten layer is formed using an ALD apparatus, a $WF_6$ gas and a $B_2H_6$ gas are sequentially introduced a plurality of times to form an initial tungsten layer, and then a $WF_6$ gas and an $H_2$ gas are used to form a tungsten layer. Note that an $SiH_4$ gas may be used instead of a $B_2H_6$ gas. These gases may be controlled by a mass flow controller.

<<Chemical Vapor Deposition (CVD) Apparatus>>

Deposition of a film formation material can be performed on the processed member by the CVD apparatus using a chemical vapor deposition method. For example, a film formation apparatus using a plasma CVD method can be used.

Note that a film formation apparatus using a metal organic chemical vapor deposition (MOCVD) method or a film formation apparatus using a sputtering method can be also used instead of or in addition to a CVD apparatus.

<<Processed Member Support 110>>

The processed member support 110 is configured to support the first base 310. The processed member support 110 may be also configured to move the first base 310 relatively to the evaporation source 120A.

For example, the processed member support 110 may have a structure holding or supporting an edge of the first base 310 or the vicinity thereof. Specifically, a member provided with a clamp mechanism or a supporting member with an L shape or the like can be used. Alternatively, a plurality of structures holding or supporting the first base 310 may be provided. Specifically, in the case where the first base 310 has a rectangular shape, the four corners of the first base 310 or the vicinity thereof may be supported.

The processed member support 110 can be moved relatively to the evaporation source 120A with use of, for example, the power mechanism 140. Specifically, a servomotor, a stepping motor, or an air cylinder may be used to move the processed member support 110. Specifically, the processed member support 110 may rotate over the evaporation source 120A or pass across the evaporation source 120A.

Note that the processed member support 110 may be configured to maintain the position of the first base 310 relative to the shadow mask 170, e.g., closely attach the first base 310 to the shadow mask 170. Specifically, the first base 310 may be pressed against the shadow mask with use of an elastic body such as a spring. Alternatively, a magnet or the like may be provided so that the first base 310 is interposed between the magnet and the shadow mask, thereby attracting the shadow mask towards the first base 310.

There is no particular limitation on the first base 310 as long as it has heat resistance high enough to withstand a manufacturing process and a thickness and a size that allow the first base 310 to be placed in a manufacturing apparatus.

In addition, the first base 310 can include a variety of functional layers, e.g., a layer including a functional circuit, a functional element, an optical element, or a functional film or a layer including a plurality of components selected from these examples. Specific examples are a pixel circuit of a display device, a driver circuit of a pixel, a display element, a color filter, and a moisture-proof film that are publicly known; and a layer including a plurality of layers selected from the these examples.

For the first base 310, an organic material, an inorganic material, a composite material of an organic material and an inorganic material, or the like can be used.

For example, an inorganic material such as glass, ceramic, or metal can be used for the first base 310.

Specifically, non-alkali glass, soda-lime glass, potash glass, crystal glass, or the like can be used for the first base 310.

Specifically, an inorganic oxide film, an inorganic nitride film, an inorganic oxynitride film, or the like can be used for the first base 310. For example, a silicon oxide film, a silicon nitride film, a silicon oxynitride film, or an alumina film can be used for the first base 310.

For example, an organic material such as a resin, a resin film, or plastic can be used for the first base 310.

Specifically, a resin film or resin plate of polyester, polyolefin, polyamide, polyimide, polycarbonate, an acrylic resin, or the like can be used for the first base 310.

For example, a composite material such as a resin film to which a thin glass plate or a film of an inorganic material is attached can be used for the first base 310.

For example, a composite material formed by dispersing a fibrous or particulate metal, glass, inorganic material, or the like into a resin film can be used for the first base 310.

For example, a composite material formed by dispersing a fibrous or particulate resin, organic material, or the like into an inorganic material can be used for the first base 310.

Furthermore, a single-layer material or a stacked-layer material in which a plurality of layers are stacked can be used for the first base 310. For example, a stacked-layer material in which a material, an insulating layer that prevents diffusion of impurities contained in the material, and the like are stacked can be used for the first base 310.

Specifically, a stacked-layer material in which glass and one or a plurality of films that prevent diffusion of impurities contained in the glass and that are selected from a silicon oxide film, a silicon nitride film, a silicon oxynitride film, and the like are stacked can be used for the first base 310.

<<Shadow Mask Support 115>>

The shadow mask support 115 is configured to support the shadow mask 170. The shadow mask support 115 may also be configured to move the shadow mask relatively to the evaporation source 120A.

For example, the shadow mask support 115 may have a structure holding or supporting an edge of the shadow mask 170 or the vicinity thereof. Specifically, a member provided with a clamp mechanism or a supporting member with an L shape or the like can be used. Alternatively, a plurality of structures holding or supporting the shadow mask 170 may be provided. Specifically, in the case where the shadow mask 170 has a rectangular shape, the four corners of the shadow mask 170 or the vicinity thereof may be supported.

The shadow mask support 115 can be moved relatively to the evaporation source 120A with use of, for example, the power mechanism 140. Specifically, a servomotor, a stepping motor, or an air cylinder may be used to move the shadow mask support 115. Specifically, the shadow mask support 115 may rotate over the evaporation source 120A or pass across the evaporation source 120A.

<<Shadow Mask 170>>

The shadow mask 170 includes a shielding region that shields a film formation material and an opening region surrounded by the shielding region.

<<Evaporation Source>>

The film formation apparatus 100 includes one or more evaporation sources, e.g., the evaporation source 120A and the evaporation source 120B.

The same material can be ejected from the evaporation source 120A and the evaporation source 120B. This increases the thickness of the film formation material that is deposited on the surface of the first base 310 per unit time.

Different materials may be ejected from the evaporation source 120A and the evaporation source 120B. As a result, a film including a mixture of the different materials can be formed on the surface of the first base 310, i.e., co-evaporation can be carried out.

The evaporation source 120A is configured to eject a film formation material and preferably has directivity, for example, in the direction in which the film formation material is ejected. This increases the efficiency of use of the film formation material.

Specifically, a point evaporation source, a linear evaporation source, or the like can be used as the evaporation source 120A. Alternatively, it is possible to use an evaporation source in which point sources are arranged linearly or in a matrix, or an evaporation source from which a vaporized film formation material is ejected through a slit.

The film formation apparatus 100 may be configured to move the evaporation source 120A relatively to the processed member support 110. For example, film formation may be performed while the evaporation source 120A is moved relatively to the first base 310 with use of a power mechanism.

<<Film Formation Chamber>>

The pressure in the film formation chamber 190 can be reduced to atmospheric pressure or lower, e.g., $10^{-3}$ Pa or lower.

The pressure in the film formation chamber 190 can be reduced with the evacuation unit 197. For example, a mechanical pump, a turbo pump, or/and a cryopump can be used as the evacuation unit 197.

The inside of the film formation chamber 190 can be filled with a gas. The pipe 196 can supply, for example, a nitrogen gas to the film formation chamber.

The film formation chamber 190 can be configured to heat the inner wall. This allows molecules adsorbed on the inner wall to be removed efficiently. For example, a heater, or a pipe supplied with a heating medium may be provided on the wall.

This embodiment can be combined with any of the other embodiments in this specification as appropriate.

Embodiment 4

In this embodiment, a structure of a functional panel of one embodiment of the present invention which can be used for an input/output device will be described with reference to FIGS. 11A to 11D, FIGS. 12A to 12D, and FIG. 13.

FIGS. 11A to 11D, FIGS. 12A to 12D, and FIG. 13 illustrate a structure of a functional panel of one embodiment of the present invention.

Figure 11A:
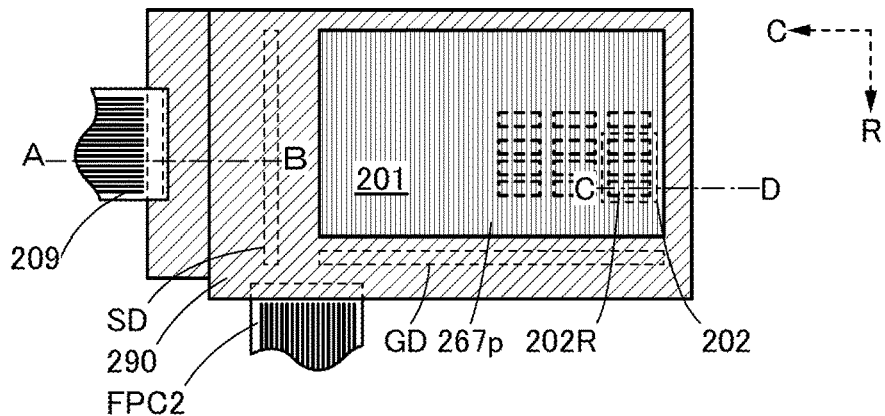
FIGS. 11A to 11D are diagrams illustrating a structure of a functional panel of one embodiment.
Figure 11B:
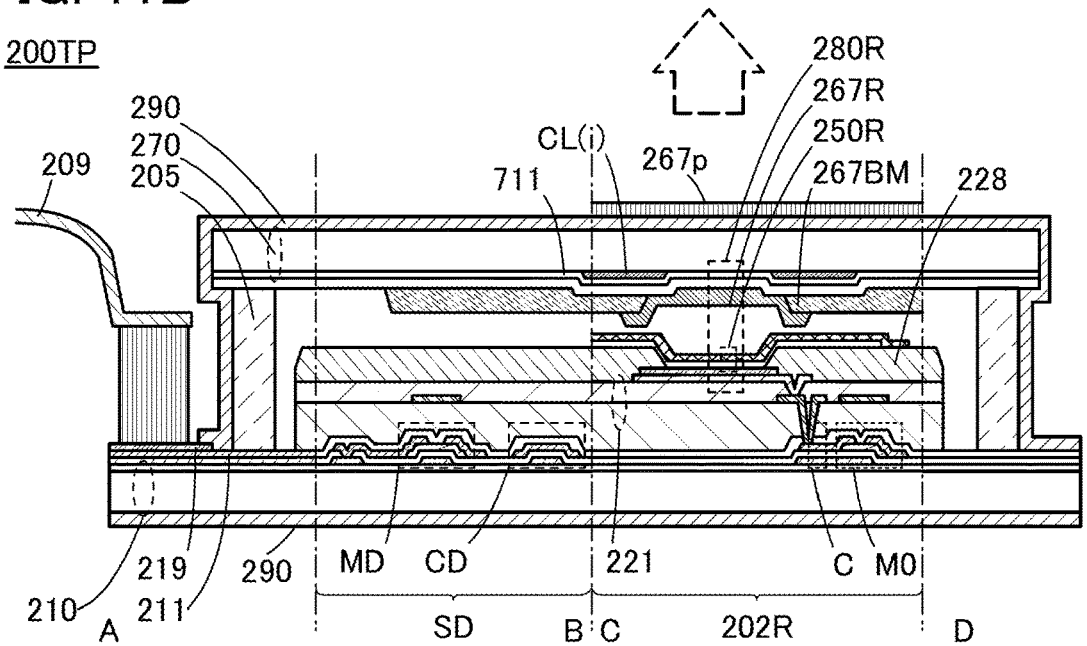
Figure 11C:
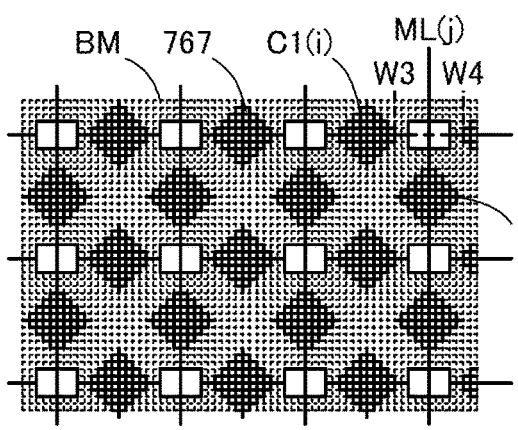
Figure 11D:
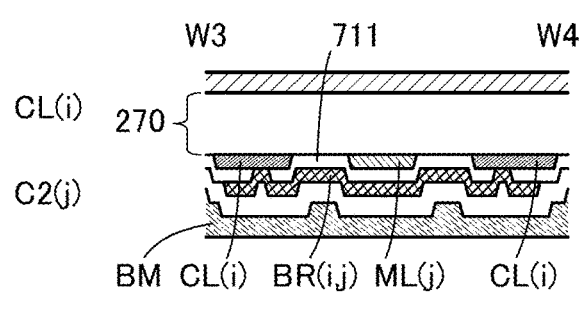
Figure 12A:
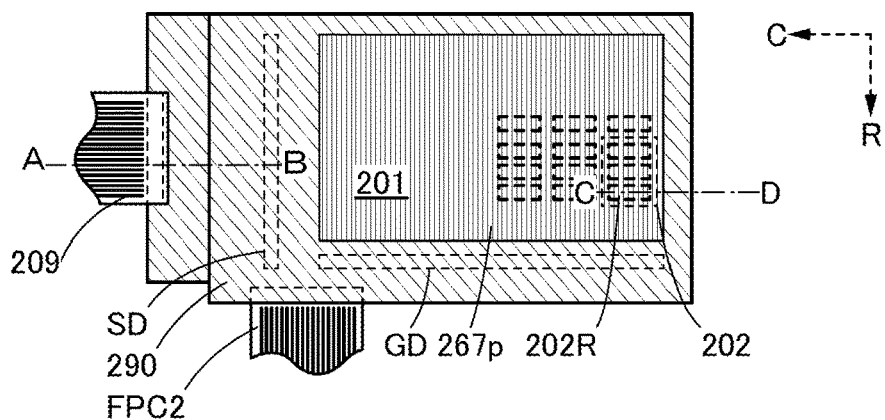
FIGS. 12A to 12D are diagrams illustrating a structure of a functional panel of one embodiment.
Figure 12B:
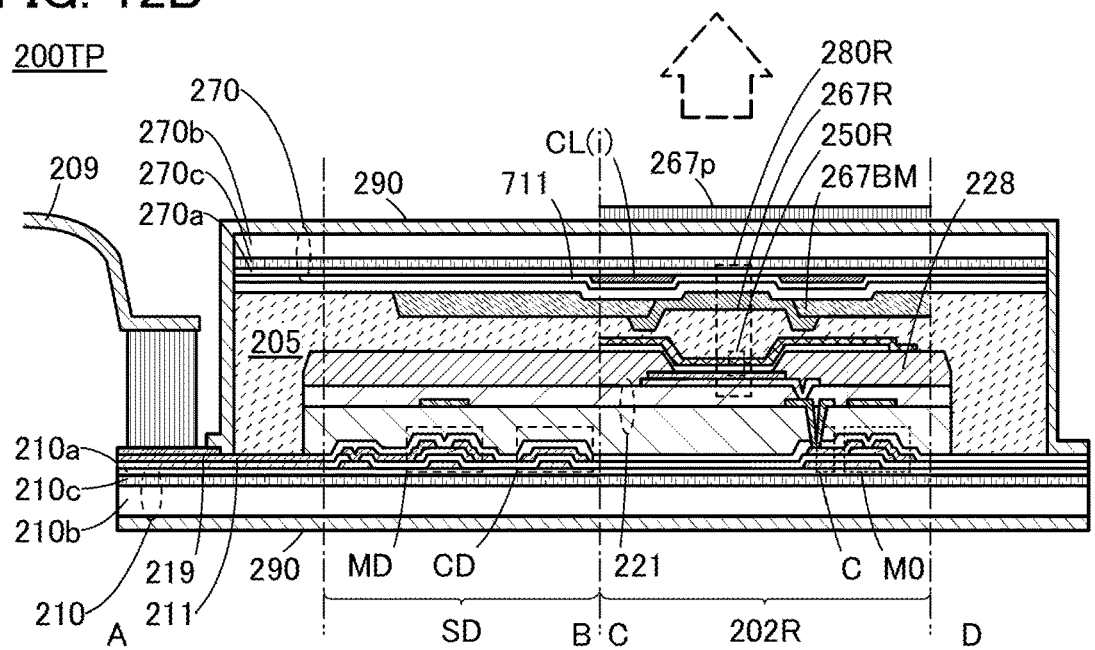
Figure 12C:
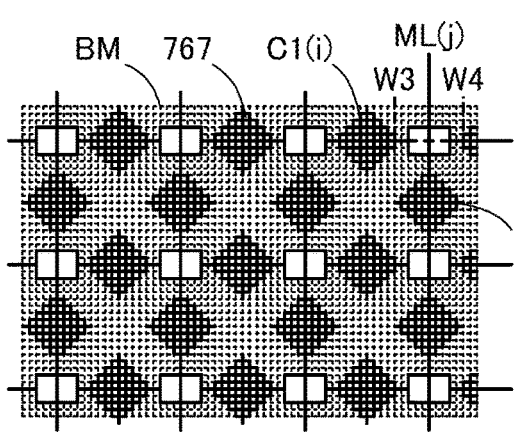
Figure 12D:
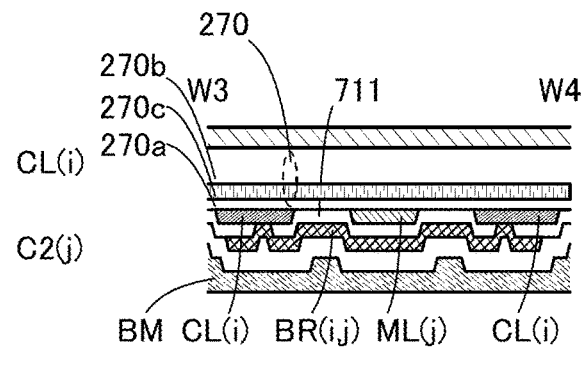

FIG. 11A is a top view of a functional panel 200TP of one embodiment of the present invention, and FIG. 11B is a cross-sectional view taken along lines A-B and C-D in FIG. 11A. FIG. 11C is a top view illustrating a structure of part of the functional panel 200TP, and FIG. 11D is a cross-sectional view taken along line W3-W4 in FIG. 11C.

Figure 13:
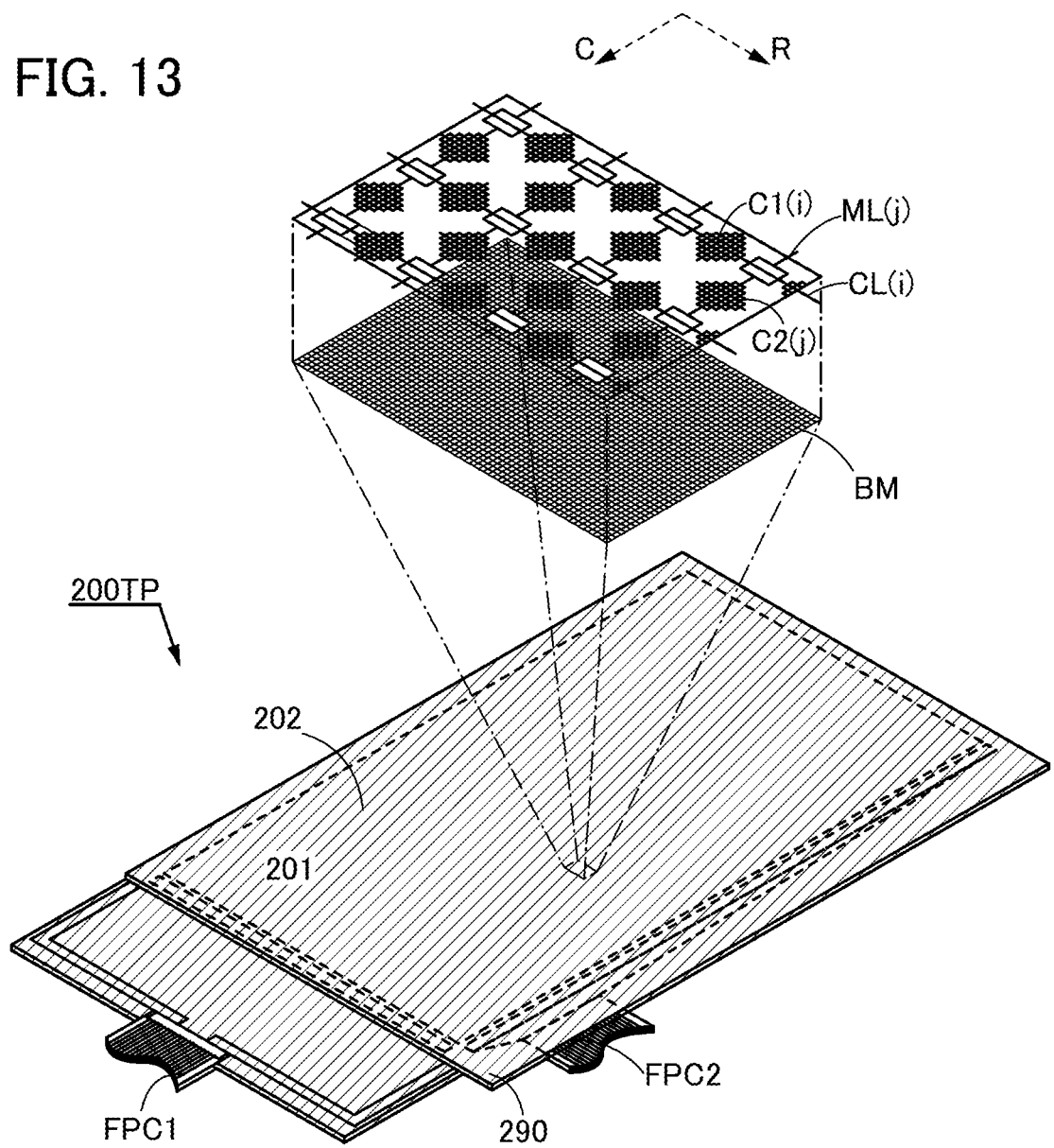
FIG. 13 is a diagram illustrating a structure of a functional panel of one embodiment.

FIG. 13 is a projection view illustrating the functional panel 200TP of one embodiment of the present invention. Note that for convenience of description, part of the functional panel 200TP is enlarged.

<Structure Example of Functional Panel>

The functional panel 200TP described in this embodiment includes the first base 210; the second base 270 having a region overlapping with the first base 210; the bonding layer 205 that bonds the second base 270 to one of surfaces of the first base 210; the insulating layer 290 in contact with the first base 210, the second base 270, and the bonding layer 205; and the functional layer located in a region surrounded by the first base 210, the second base 270, and the bonding layer 205.

The functional layer includes a plurality of functional elements. Specifically, the functional layer includes the pixel 202 and a sensing element in the region 201. Thus, the functional panel 200TP is configured to be supplied with an image signal and display an image. The functional panel 200TP is also configured to receive a control signal and supply a sensing signal.

Note that the functional panel 200TP can be referred to as an input/output panel or a touch panel.

The functional panel 200TP of one embodiment of the present invention includes the pixel 202, the driving circuit GD for supplying a control signal to the pixel 202, the driving circuit SD for supplying a display signal to the pixel 202, and the region 201 provided with the pixel 202 (see FIGS. 11A and 11B).

The pixel 202 is supplied with a display signal (see FIG. 11A). The pixel 202 includes the subpixel 202R and the like. The subpixel 202R has a function of displaying red. In addition, the pixel 202 includes a subpixel for displaying green, a subpixel for displaying blue, and the like.

The subpixel 202R includes a pixel circuit and the display module 280R (see FIG. 11B).

The pixel circuit includes the driving transistor MO and the capacitor C.

The display module 280R includes the light-emitting element 250R and the coloring layer 267R having a region overlapping with the light-emitting element 250R on a light-emitting side. Note that the light-emitting element 250R is one embodiment of the display element.

The light-emitting element 250R includes a lower electrode, an upper electrode, and a layer containing a light-emitting organic compound.

The circuit includes the driving transistor MO and is provided between the first base 210 and the light-emitting element 250R. The insulating film 221 is provided between the circuit and the light-emitting element 250R.

The driving transistor MO includes the second electrode. The second electrode of the driving transistor MO is electrically connected to the lower electrode of the light-emitting element 250R through an opening provided in the insulating film 221.

The capacitor C includes the first electrode and the second electrode. The first electrode of the capacitor C is electrically connected to the gate of the driving transistor MO. The second electrode of the capacitor C is electrically connected to the second electrode of the driving transistor MO.

The driver circuit SD includes the transistor MD and the capacitor CD.

The functional panel 200TP of one embodiment of the present invention includes the wiring 211 electrically connected to the driving circuit SD, the terminal 219 electrically connected to the wiring 211, and a flexible printed circuit 209 electrically connected to the terminal 219.

The light-blocking layer 267BM having an opening in a region overlapping with the subpixel 202R is also included.

The partition 228 which has an opening in a region overlapping with the light-emitting element 250R and covers an end portion of the lower electrode is also included.

The functional film 267p having a region overlapping with the region 201 is also included (see FIG. 11B).

Note that the functional panel 200TP can display data on the second base 270 side.

The functional panel 200TP includes the second base 270. The second base 270 supports a plurality of control lines CL(i) and a plurality of signal lines ML(j).

The control line CL(i) is extended in a row direction (a direction indicated by an arrow R in the figure) and configured to be supplied with a control signal (see FIG. 13).

The signal line ML(j) is extended in a column direction (a direction indicated by an arrow C in the figure) and configured to supply a sensing signal.

The functional panel 200TP includes a first electrode C1(i) electrically connected to the control line CL(i) and a second electrode C2(j) electrically connected to the signal line ML(j). The second electrode C2(j) includes a region not overlapping with the first electrode C1(i) (see FIG. 11C and FIG. 13).

The first electrode C1(i) or the second electrode C2(j) includes a conductive film in which regions overlapping with the pixels 202 or the subpixels 202R have light-transmitting properties. Alternatively, the first electrode C1(i) or the second electrode C2(j) includes a net-like conductive film whose openings 767 overlap with the pixels 202 or the subpixels 202R.

The functional panel 200TP of one embodiment of the present invention includes a terminal electrically connected to the control line CL(i) and a terminal electrically connected to the signal line ML(j). Note that the terminal is electrically connected to a flexible printed circuit FPC2.

The functional panel 200TP described in this embodiment includes the first base 210; the second base 270; the bonding layer 205 that bonds the first base 210 to the second base 270; and the functional layer located in a region surrounded by the first base 210, the second base 270, and the bonding layer 205. The functional layer includes a display element and a sensing element. Thus, a supplied image signal can be displayed and a sensing signal can be supplied in accordance with a supplied control signal. Thus, the novel, highly convenient or reliable functional panel can be provided.

For example, the functional panel 200TP is configured to sense an approaching object and supply sensing data associated with positional data of the approaching object. Thus, sensing data including the sensed position, track, or the like can be supplied. Specifically, a user of the functional panel 200TP can make various gestures (e.g., tap, drag, swipe, and pinch in) using his/her finger or the like that approaches or is in contact with the functional panel 200TP as a pointer.

Note that a user of the functional panel 200TP can supply a variety of operation instructions to an arithmetic device. For example, an arithmetic device supplied with sensing data supplied by the functional panel 200TP can determine whether or not the supplied data meets a predetermined condition based on a program or the like and then execute an instruction associated with a predetermined gesture.

In addition, the functional panel 200TP can display data supplied by an arithmetic device, for example.

The functional panel 200TP includes the insulating layer 290.

For example, a ceramic coat layer or a hard coat layer can be used as the insulating layer. Specifically, a layer containing aluminum oxide or a layer containing a UV curable resin can be used.

The functional panel 200TP includes the functional film 267p.

An anti-reflective layer or the like that controls the intensity of external light reflected by the functional panel can be used as the functional film. Specifically, a circular polarizing plate or the like can be used.

Individual components included in the functional panel 200TP will be described below. Note that these components cannot be clearly distinguished and one component also serves as another component or includes part of another component in some cases.

For example, the functional panel 200TP serves as a touch panel, a sensing panel, and a display panel.

<Overall Structure>

The functional panel 200TP described in this embodiment includes the first base 210, the second base 270, the bonding layer 205, the insulating layer 290, and the functional layer.

The functional layer includes the pixel 202, the driving circuit GD, the driving circuit SD, the region 201, the subpixel 202R, the driving transistor MO, the capacitor C, the display module 280R, the light-emitting element 250R, the coloring layer 267R, the pixel circuit, the insulating film 221, the wiring 211, the terminal 219, the light-blocking layer 267BM, and the partition 228.

The functional layer includes the control line CL(i), a wiring BR(i,j), the signal line ML(j), the first electrode C1(i), and the second electrode C2(j).

The functional panel 200 includes the flexible printed circuit 209, a flexible printed circuit FPC1, the flexible printed circuit FPC2, and the functional film 267p.

<<First Base, Second Base, Bonding Layer, Insulating Layer>>

As the components of the first base 210, the second base 270, the bonding layer 205, and the insulating layer 290 can be similar to those in the functional panel described in Embodiment 1.

Note that a flexible material can be used for the first base 210 and the second base 270. For example, it is possible to use a material having flexibility high enough to be bent or be folded. Specifically, a stack including a flexible base 210b, a barrier film 210a that inhibits impurity diffusion, and a resin layer 210c that attaches the flexible base 210b to the barrier film 210a can be used as the first base 210. A stack including the flexible base 270b, the barrier film 270a that inhibits impurity diffusion, and the resin layer 270c that attaches the flexible base 270b and the barrier film 270a can be used as the second base 270 (see FIGS. 12A to 12D).

<<Functional Layer>>

As the components of the subpixel 202R, the display element, the pixel circuit, the driving circuit GD, the wiring 211, and the terminal 219 can be similar to those in the functional panel described in Embodiment 1.

<<Sensing Element, Sensing Circuit>>

A sensing element for sensing capacitance, illuminance, magnetic force, a radio wave, pressure, or the like and supplying a signal based on the sensed physical quantity can be used for the functional layer.

For example, a conductive film, a photoelectric conversion element, a magnetic sensing element, a piezoelectric element, a resonator, or the like can be used as the sensing element.

For example, a sensing circuit configured to supply a signal that varies on the basis of the parasitic capacitance of a conductive film can be used for the functional layer. Thus, a finger or the like which approaches the conductive film in the air can be sensed with change in capacitance.

Specifically, a control signal is supplied to the first electrode C1(i) with the control line CL(i), and the potential of the second electrode C2 (j) which changes on the basis of the supplied control signal and the capacitance is obtained with the signal line ML(j) and can be supplied as a sensing signal.

For example, a circuit including a capacitor one electrode of which is connected to a conductive film can be used as a sensing circuit.

The control line CL(i) includes the wiring BR(i,j). In the wiring BR(i,j), the control line CL(i) intersects with the signal line ML(j) (see FIG. 11C). An insulating film 711 is provided between the wiring BR(i,j) and the signal line ML(j) (see FIG. 11D). Thus, a short circuit between the wiring BR(i,j) and the signal line ML(j) can be prevented.

For example, the functional panel 200TP senses a change in electrostatic capacitance between the functional panel 200TP and an object that approaches or is in contact with the functional panel 200TP, and supplies a sensing signal.

The sensing element may be formed by depositing a film for forming the sensing element over the second base 270 and processing the film.

Alternatively, the functional panel 200TP may be formed in such a manner that part of the functional panel 200TP is formed over another base, and the part is transferred to a base 610.

<<Wiring>>

The functional panel 200TP includes wirings. The wirings include the control line CL(i), the signal line ML(j), and the like.

A conductive material can be used for the wirings and the like.

For example, an inorganic conductive material, an organic conductive material, metal, conductive ceramics, or the like can be used for the wiring.

Specifically, a metal element selected from aluminum, gold, platinum, silver, chromium, tantalum, titanium, molybdenum, tungsten, nickel, iron, cobalt, yttrium, zirconium, palladium, and manganese; an alloy including any of the above metal elements; an alloy including any of the above metal elements in combination; or the like can be used for the wiring. In particular, one or more elements selected from aluminum, chromium, copper, tantalum, titanium, molybdenum, and tungsten are preferably included. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Specifically, a stacked-layer film in which a film of an element selected from titanium, tantalum, tungsten, molybdenum, chromium, neodymium, and scandium is stacked over an aluminum film can be used. Alternatively, a stacked-layer film in which an alloy film containing a plurality of elements selected from titanium, tantalum, tungsten, molybdenum, chromium, neodymium, and scandium is stacked over an aluminum film can be used. Alternatively, a stacked-layer film in which a nitride film of an element selected from titanium, tantalum, tungsten, molybdenum, chromium, neodymium, and scandium is stacked over an aluminum film can be used.

Alternatively, a conductive oxide such as indium oxide, indium tin oxide, indium zinc oxide, zinc oxide, or zinc oxide to which gallium is added can be used.

Alternatively, graphene or graphite can be used. The film including graphene can be formed, for example, by reducing a film including graphene oxide. As a reducing method, a method using heat, a method using a reducing agent, or the like can be employed.

Alternatively, a conductive macromolecule can be used.
<<Others>>

The functional panel 200TP includes the functional film 267p.

For example, an inorganic material, an organic material, or a composite material of an inorganic material and an organic material can be used for the functional film 267p. Specifically, a ceramic coat layer containing alumina, silicon oxide, or the like, a hard coat layer containing a UV curable resin or the like, an anti-reflection film, a circularly polarizing plate, or the like can be used for the functional film 267p.

This embodiment can be combined with any of the other embodiments in this specification as appropriate.

Embodiment 5

In this embodiment, a structure of an data processing device of one embodiment of the present invention will be described with reference to FIGS. 14A to 14C.

Figure 14A:
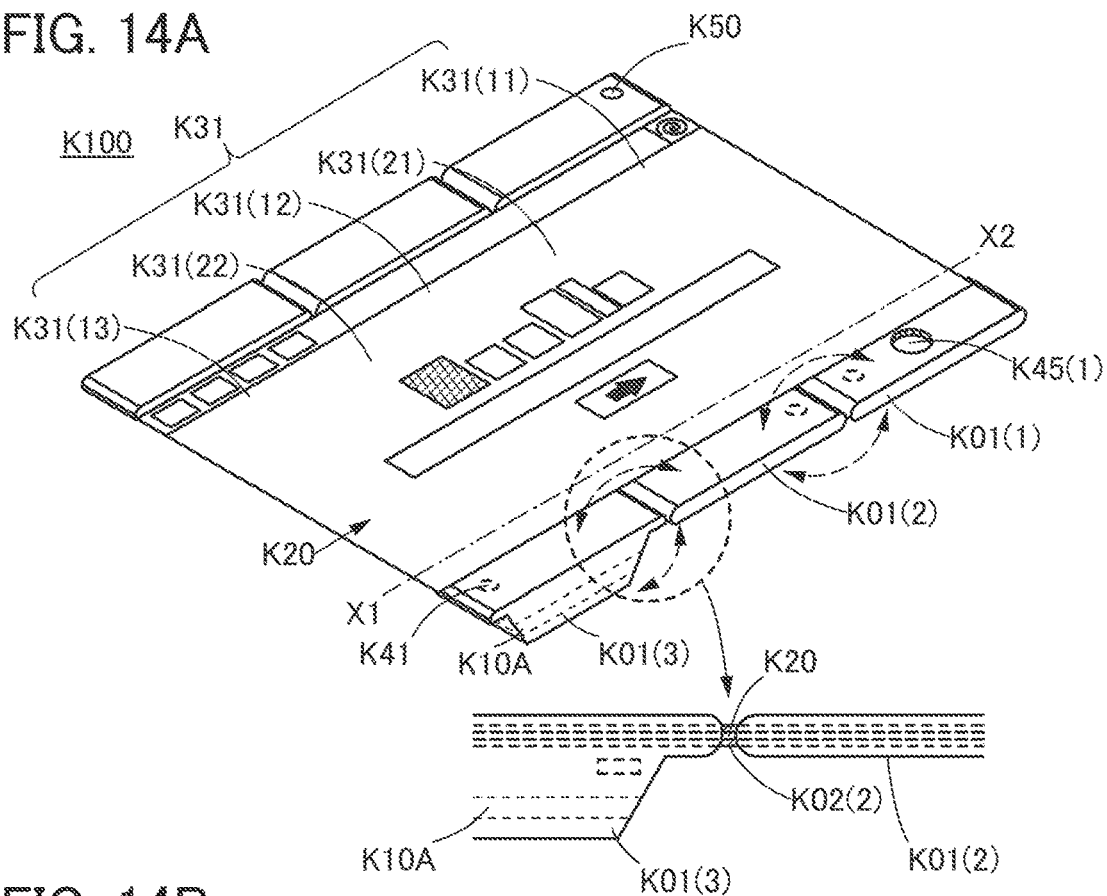
FIGS. 14A to 14C are diagrams illustrating a structure of an data processing device of one embodiment.
Figure 14B:
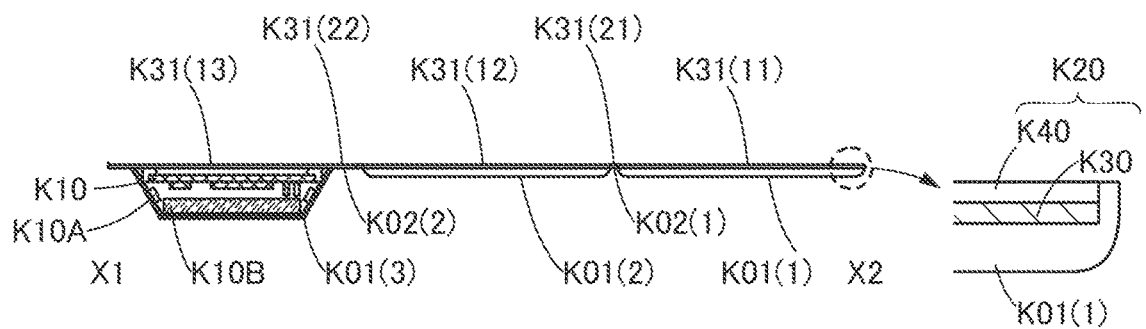
Figure 14C:
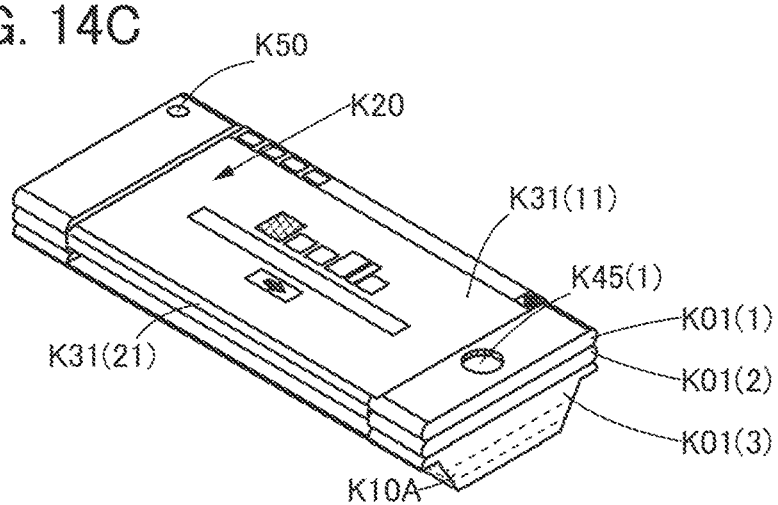

FIGS. 14A to 14C illustrate an data processing device of one embodiment of the present invention.

FIG. 14A is a projection view illustrating an input/output device K20 of an data processing device K100 of one embodiment of the present invention which is unfolded. FIG. 14B is a cross-sectional view of the data processing device K100 taken along line X1-X2 in FIG. 14A. FIG. 14C is a projection view illustrating the input/output device K20 which is folded.
<Example of Structure of Data Processing Device>

The data processing device K100 described in this embodiment includes the input/output device K20, an arithmetic device K10, or housings K01(1) to K01(3) (see FIGS. 14A to 14C).

<<Input/Output Device>>

For example, the functional panel described in Embodiment 4 can be used for the input/output device.

The input/output device K20 includes a display device K30 and an input device K40 (see FIG. 14B). The input/output device K20 is supplied with image data V and supplies sensing data S.

The display device K30 is supplied with the image data V and the input device K40 supplies the sensing data S.

The input/output device K20, in which the input device K40 and the display device K30 integrally overlap with each other, serves not only as the display device K30 but also as the input device K40.

The input/output device K20 using a touch sensor as the input device K40 and a display panel as the display device K30 can be referred to as a touch panel.

The display device K30 includes a region K31 where a first region K31(11), a first bendable region K31(21), a second region K31(12), a second bendable region K31(22), and a third region K31(13) are arranged in stripes in this order (see FIG. 14A).

The display device K30 can be folded and unfolded along a first fold line formed in the first bendable region K31(21) and a second fold line formed in the second bendable region K31(22) (see FIGS. 14A and 14C).
<<Arithmetic Device>>

The arithmetic device K10 includes an arithmetic portion and a storage unit that stores a program to be executed by the arithmetic portion. The arithmetic device supplies the image data V and is supplied with the sensing data S.
<<Housing>>

A housing includes the housing K01(1), a hinge K02(1), the housing K01(2), a hinge K02(2), or the housing K01(3) which are placed in this order.

In the housing K01(3), the arithmetic device K10 is stored. The housings K01(1) to K01(3) hold the input/output device K20, and enable the input/output device K20 to be folded and unfolded (see FIG. 14B).

In this embodiment, the data processing device including the three housings and the two hinges connecting the three housings is given as an example. The input/output device K20 in this data processing device can be bent at the positions with the two hinges.

Note that n housings (n is a natural number of two or more) may be connected with one another with (n−1) hinges. The data processing device having this structure can be folded with the input/output device K20 bent at (n−1) positions.

The housing K01(1) overlaps with the first region K31(11) and includes a button K45(1).

The housing K01(2) overlaps with the second region K31(12).

The housing K01(3) overlaps with the third region K31(13) and stores the arithmetic device K10, an antenna K10A, and a battery K10B.

The hinge K02(1) overlaps with the first bendable region K31(21) and connects the housing K01(1) rotatably to the housing K01(2).

The hinge K02(2) overlaps with the second bendable region K31(22) and connects the housing K01(2) rotatably to the housing K01(3).

The antenna K10A is electrically connected to the arithmetic device K10 and supplies a signal or is supplied with a signal.

In addition, the antenna K10A is wirelessly supplied with power from an external device and supplies power to the battery K10B.

The battery K10B is electrically connected to the arithmetic device K10 and supplies power or is supplied with power.

<<Folding Sensor>>

A folding sensor K41 senses whether the housing is folded or unfolded and supplies information showing the state of the housing.

The arithmetic device K10 is supplied with data showing the state of the housing.

In the case where the data showing the state of the housing K01 is data showing a folded state, the arithmetic device K10 supplies the image data V including a first image to the first region K31(11) (see FIG. 14C).

In the case where the data showing the state of the housing K01 is data showing an unfolded state, the arithmetic device K10 supplies the image data V to the region K31 of the display device K30 (see FIG. 14A).

<<Sensing Portion>>

A sensing portion K50 can sense illuminance under usage environment of the display device K30, and supply sensing data including data of the illuminance.

For example, a photoelectric conversion element and a sensor circuit that supplies data of environmental illuminance on the basis of a signal supplied from the photoelectric conversion element can be used for the sensing portion K50.

This embodiment can be combined with any of the other embodiments in this specification as appropriate.

Embodiment 6

In this embodiment, a structure of a data processing device of one embodiment of the present invention will be described with reference to FIGS. 15A, 15B, 15C1, and 15C2.

FIGS. 15A, 15B, 15C1, and 15C2 illustrate the data processing devices of embodiments of the present invention.

FIG. 15A is a projection view of a data processing device 3000A of one embodiment of the present invention.

FIG. 15B is a projection view of a data processing device 3000B of one embodiment of the present invention.

FIGS. 15C1 and 15C2 are a top view and a bottom view of a data processing device 3000C of one embodiment of the present invention.

<<Data Processing Device A>>

The data processing device 3000A includes an input/output portion 3120 and a housing 3101 supporting the input/output portion 3120 (see FIG. 15A).

The input/output portion 3120 includes a functional panel of one embodiment of the present invention. For example, the functional panel described in Embodiment 4 can be used for the input/output portion 3120.

The data processing device 3000A further includes an arithmetic portion, a memory portion storing a program that is executed by the arithmetic portion, and a power source such as a battery supplying power for driving the arithmetic portion.

Note that the housing 3101 stores the arithmetic portion, the memory portion, the battery, and the like.

The data processing device 3000A can display data on its side surface and/or top surface.

A user of the data processing device 3000A can supply operation instructions by using a finger in contact with the side surface and/or the top surface.

<<Data Processing Device B>>

A data processing device 3000B includes the housing 3101 and a housing 3101b connected to the housing 3101 with a hinge (see FIG. 15B).

The housing 3101 supports the input/output portion 3120.

The housing 3101b supports an input/output portion 3120b.

The input/output portion 3120 or the input/output portion 3120b includes a functional panel of one embodiment of the present invention. For example, the functional panel described in Embodiment 4 can be used for the input/output portion 3120.

The data processing device 3000B further includes an arithmetic portion, a memory portion storing a program that is executed by the arithmetic portion, and a power source such as a battery supplying power for driving the arithmetic portion.

Note that the housing 3101 stores the arithmetic portion, the memory portion, the battery, and the like.

The data processing device 3000B enables the input/output portion 3120 or the input/output portion 3120b to display data.

A user of the data processing device 3000B can supply operation instructions by using a finger in contact with the input/output portion 3120 or the input/output portion 3120b.

<<Data processing device C>>

The data processing device 3000C includes the input/output portion 3120 and the housing 3101 supporting the input/output portion 3120 (see FIGS. 15C1 and 15C2).

The input/output portion 3120 or the input/output portion 3120b includes a functional panel of one embodiment of the present invention. For example, the functional panel described in Embodiment 4 can be used for the input/output portion 3120.

The data processing device 3000C further includes an arithmetic portion, a memory portion storing a program that is executed by the arithmetic portion, and a power source such as a battery supplying power for driving the arithmetic portion.

Note that the housing 3101 stores the arithmetic portion, the memory portion, the battery, and the like.

This embodiment can be combined with any of the other embodiments in this specification as appropriate.

Embodiment 7

In this embodiment, a structure of a data processing device of one embodiment of the present invention will be described with reference to FIGS. 16A1, 16A2, 16A3, 16B1, 16B2, 16C1, and 16C2.

FIGS. 16A1, 16A2, 16A3, 16B1, 16B2, 16C1, and 16C2 illustrate the data processing device of one embodiment of the present invention.

FIGS. 16A1, 16A2, and 16A3 are projection views illustrating an data processing device of one embodiment of the present invention.

FIGS. 16B1 and 16B2 are projection views illustrating an data processing device of one embodiment of the present invention.

FIGS. 16C1 and 16C2 are a top view and a bottom view of a data processing device of one embodiment of the present invention.

<<Data Processing Device A>>

A data processing device 4000A includes an input/output portion 4120 and a housing 4101 supporting the input/output portion 4120 (see FIGS. 16A1 to 16A3).

The input/output portion 4120 includes a functional panel of one embodiment of the present invention. For example, the functional panel described in Embodiment 4 can be used for the input/output portion 4120.

The data processing device 4000A further includes an arithmetic portion, a memory portion storing a program that is executed by the arithmetic portion, and a power source such as a battery supplying power for driving the arithmetic portion.

Note that the housing 4101 stores the arithmetic portion, the memory portion, the battery, and the like.

The data processing device 4000A can display data on its side surface and/or top surface.

A user of the data processing device 4000A can supply operation instructions by using a finger in contact with the side surface and/or the top surface.

<<Data processing device B>>

An data processing device 4000B includes the input/output portion 4120 and an input/output portion 4120*b* (see FIGS. 16B1 and 16B2).

The data processing device 4000B further includes the housing 4101 and a belt-shaped flexible housing 4101*b* that support the input/output portion 4120.

The input/output portion 4120 or the input/output portion 4120*b* includes a functional panel of one embodiment of the present invention. For example, the functional panel described in Embodiment 4 can be used for the input/output portion 4120.

The data processing device 4000B further includes the housing 4101 supporting the input/output portion 4120*b*.

The data processing device 4000B further includes an arithmetic portion, a memory portion that stores a program to be executed by the arithmetic portion, and a power source such as a battery supplying power for driving the arithmetic portion.

Note that the housing 4101 stores the arithmetic portion, the memory portion, the battery, and the like.

The data processing device 4000B can display data on the input/output portion 4120 supported by the belt-shaped flexible housing 4101*b*.

A user of the data processing device 4000B can supply operation instructions by using a finger in contact with the input/output portion 4120.

<<Data Processing Device C>>

A data processing device 4000C includes the input/output portion 4120 and the housing 4101 and the housing 4101*b* supporting the input/output portion 4120 (see FIGS. 16C1 and 16C2).

The input/output portion 4120 and the housing 4101*b* have flexibility.

The input/output portion 4120 includes a functional panel of one embodiment of the present invention. For example, the functional panel described in Embodiment 4 can be used for the input/output portion 4120.

The data processing device 4000C further includes an arithmetic portion, a memory portion storing a program that is executed by the arithmetic portion, and a power source such as a battery supplying power for driving the arithmetic portion.

Note that the housing 4101 stores the arithmetic portion, the memory portion, the battery, and the like.

The data processing device 4000C can be folded in two at a portion of the housing 4101*b*.

This embodiment can be combined with any of the other embodiments in this specification as appropriate.

For example, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text.

Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and E A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

EXPLANATION OF REFERENCE

BR: wiring, FPC2: flexible printed circuit, K01: housing, K02: hinge, K10: arithmetic device, K10A: antenna, K10B: battery, K20: input/output device, K30: display device, K31: region, K40: input/output device, K41: sensor, K45: button, K50: sensing portion, K100: data processing device, MO: driving transistor, 10: processed member, 10B: processed member, 100: film formation device, 100A: film formation device, 100B: film formation device, 100C: film formation device, 100D: film formation device, 110: processed member support, 115: shadow mask support, 120A: evaporation source, 120B: evaporation source, 121A: shielding plate, 122A: sensor, 140: power mechanism, 170: shadow mask, 180: chamber, 181$a$: source material supply portion, 181$b$: source material supply portion, 182$a$: high-speed valve, 182$b$: high-speed valve, 183$a$: source material introduction port, 183$b$: source material introduction port, 184: source material exhaust port, 185: evacuation unit, 186: processed member support, 190: film formation chamber, 195: door valve, 196: pipe, 197: evacuation unit, 198: sensor, 200: functional panel, 200(1): functional panel, 200(2): functional panel, 200(3): functional panel, 200B: functional panel, 200TP: functional panel, 201: region, 202: pixel, 202R: subpixel, 205: bonding layer, 209: flexible printed circuit, 210: first base, 210$a$: barrier film, 210$b$: base, 210$c$: resin layer, 211: wiring, 219: terminal, 221: insulating layer, 228: partition, 250R: light-emitting element, 267BM: light-blocking layer, 267$p$: functional film, 267R: coloring layer, 270: second base, 270$a$: barrier film, 270$b$: base, 270$c$: resin layer, 280R: display module, 290: insulating layer, 291: insulating layer, 300: functional panel, 305: bonding layer, 305$a$: bonding layer, 305$b$: bonding layer, 310: first base, 310$a$: first base, 310$b$: first base, 330: functional layer, 330$a$: functional layer, 330$b$: functional layer, 370: second base, 370$a$: second base, 370$b$: second base, 390: insulating layer, 390$a$: insulating layer, 390$b$: insulating layer, 610: base, 711: insulating layer, 767: opening, 1000: film formation system, 1000B: film formation system, 3000A: data processing device, 3000B: data processing device, 3000C: data processing device, 3101: housing, 3101$b$: housing, 3120: input/output portion, 3120$b$: input/output portion, 4000A: data processing device, 4000B: data processing device, 4000C: data processing device, 4101: housing, 4101$b$: housing, 4120: input/output portion, 4120$b$: input/output portion This application is based on Japanese Patent Application serial no. 2014-219065 filed with Japan Patent Office on Oct. 28, 2014 and Japanese Patent Application serial no. 2014-219066 filed with Japan Patent Office on Oct. 28, 2014, the entire contents of which are hereby incorporated by reference.

The invention claimed is:

1. A functional panel comprising:
a first insulating layer;
a second insulating layer over and in contact with the first insulating layer;
a first base over and in contact with the second insulating layer;
a second base over the first base;
a bonding layer between the first base and the second base, wherein the bonding layer is positioned inside an end portion of the second base so that the second base has a protruding part that protrudes from the bonding layer;
a functional layer comprising a light-emitting element with a microcavity structure including a reflective film, a semi-transmissive and semi-reflective film, and a layer containing a light-emitting organic compound over the first base; and
a third insulating layer being a nitride layer and being over and in contact with an entire top surface of the second base including the protruding part and with the bonding layer,
wherein the first insulating layer and the second insulating layer overlap with the functional layer,
wherein the second insulating layer is one of an oxide layer, a fluoride layer, and a sulfide layer, and
wherein the bonding layer covers the functional layer.

2. The functional panel according to claim 1, wherein the first insulating layer and the second insulating layer are the same material.

3. A module comprising:
the functional panel according to claim 1; and
an FPC or a touch sensor.

4. An data processing device comprising:
the functional panel according to claim 1; and
a microphone, an antenna, a battery, an operation switch, or a housing.

5. The functional panel according to claim 1,
wherein each of the first base and the second base has flexibility.

6. A functional panel comprising:
a first insulating layer;
a second insulating layer over and in contact with the first insulating layer;
a first base over and in contact with the second insulating layer;
a second base over the first base;
a bonding layer between the first base and the second base, wherein the bonding layer is positioned inside an end portion of the second base so that the second base has a protruding part that protrudes from the bonding layer;
a functional layer comprising a light-emitting element with a microcavity structure including a reflective film, a semi-transmissive and semi-reflective film, and a layer containing a light-emitting organic compound over the first base;
a third insulating layer being a nitride layer and being over and in contact with an entire top surface of the second base including the protruding part and with the bonding layer,
wherein the first insulating layer, the second insulating layer, and the third insulating layer overlap with the functional layer,
wherein the second insulating layer is one of an oxide layer, a fluoride layer, and a sulfide layer, and
wherein the bonding layer covers the functional layer.

7. The functional panel according to claim 6, wherein the first insulating layer and the second insulating layer are the same material.

8. A module comprising:
the functional panel according to claim 6; and
an FPC or a touch sensor.

9. An data processing device comprising:
the functional panel according to claim 6; and
a microphone, an antenna, a battery, an operation switch, or a housing.

10. The functional panel according to claim 6,
wherein each of the first base and the second base has flexibility.

* * * * *